(12) United States Patent
Lafarre et al.

(10) Patent No.: US 11,960,213 B2
(45) Date of Patent: *Apr. 16, 2024

(54) SUBSTRATE HOLDER, LITHOGRAPHIC APPARATUS, DEVICE MANUFACTURING METHOD, AND METHOD OF MANUFACTURING A SUBSTRATE HOLDER

(71) Applicant: ASML NETHERLANDS B.V., Veldhoven (NL)

(72) Inventors: Raymond Wilhelmus Louis Lafarre, Helmond (NL); Sjoerd Nicolaas Lambertus Donders, Vught (NL); Nicolaas Ten Kate, Almkerk (NL); Nina Vladimirovna Dziomkina, Eindhoven (NL); Yogesh Pramod Karade, Eindhoven (NL); Elisabeth Corinne Rodenburg, Heeze (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/299,534

(22) Filed: Apr. 12, 2023

(65) Prior Publication Data

US 2023/0251579 A1    Aug. 10, 2023

Related U.S. Application Data

(63) Continuation of application No. 17/587,236, filed on Jan. 28, 2022, now Pat. No. 11,628,498, which is a
(Continued)

(51) Int. Cl.
*G03F 7/00* (2006.01)
*B05D 3/06* (2006.01)
(Continued)

(52) U.S. Cl.
CPC .......... *G03F 7/70341* (2013.01); *B05D 3/06* (2013.01); *B05D 5/00* (2013.01); *B22F 7/062* (2013.01);
(Continued)

(58) Field of Classification Search
CPC .... G03F 7/70341; G03F 7/20; G03F 7/70416; G03F 7/707; G03F 7/70708;
(Continued)

(56) References Cited

U.S. PATENT DOCUMENTS 4,480,284 A    10/1984  Tojo et al.
5,182,170 A     1/1993  Marcus et al.
(Continued)

FOREIGN PATENT DOCUMENTS

CN    1315022    9/2001
CN    1320108    10/2001
(Continued)

OTHER PUBLICATIONS

International Search Report dated Oct. 23, 2013 in corresponding International Patent Application No. PCT/EP2013/050818.
(Continued)

*Primary Examiner* — Hung V Nguyen
(74) *Attorney, Agent, or Firm* — Pillsbury Winthrop Shaw Pittman, LLP

(57) ABSTRACT

A substrate holder for a lithographic apparatus has a main body having a thin-film stack provided on a surface thereof. The thin-film stack forms an electronic or electric component such as an electrode, a sensor, a heater, a transistor or a logic device, and has a top isolation layer. A plurality of burls to support a substrate are formed on the thin-film stack or in apertures of the thin-film stack.

20 Claims, 11 Drawing Sheets

Related U.S. Application Data continuation of application No. 17/138,480, filed on Dec. 30, 2020, now Pat. No. 11,235,388, which is a continuation of application No. 16/369,368, filed on Mar. 29, 2019, now Pat. No. 10,898,955, which is a continuation of application No. 15/261,553, filed on Sep. 9, 2016, now Pat. No. 10,245,641, which is a continuation of application No. 14/374,197, filed as application No. PCT/EP2013/050818 on Jan. 17, 2013, now Pat. No. 9,442,395.

(60) Provisional application No. 61/621,660, filed on Apr. 9, 2012, provisional application No. 61/621,648, filed on Apr. 9, 2012, provisional application No. 61/594,857, filed on Feb. 3, 2012.

(51) Int. Cl.

| | | |
|---|---|---|
| *B05D 5/00* | (2006.01) | |
| *B22F 7/06* | (2006.01) | |
| *B22F 10/00* | (2021.01) | |
| *B22F 10/20* | (2021.01) | |
| *B23K 26/342* | (2014.01) | |
| *B23K 26/354* | (2014.01) | |
| *B23Q 3/18* | (2006.01) | |
| *B33Y 10/00* | (2015.01) | |
| *B33Y 80/00* | (2015.01) | |
| *G03F 7/20* | (2006.01) | |
| *B22F 10/25* | (2021.01) | |
| *B22F 10/28* | (2021.01) | |
| *B22F 10/66* | (2021.01) | |

(52) U.S. Cl.
CPC .............. *B22F 10/00* (2021.01); *B22F 10/20* (2021.01); *B23K 26/342* (2015.10); *B23K 26/354* (2015.10); *B23Q 3/18* (2013.01); *B33Y 10/00* (2014.12); *B33Y 80/00* (2014.12); *G03F 7/20* (2013.01); *G03F 7/70416* (2013.01); *G03F 7/707* (2013.01); *G03F 7/70708* (2013.01); *G03F 7/70716* (2013.01); *G03F 7/70733* (2013.01); *G03F 7/708* (2013.01); *B22F 10/25* (2021.01); *B22F 10/28* (2021.01); *B22F 10/66* (2021.01)

(58) Field of Classification Search
CPC .. G03F 7/70716; G03F 7/70733; G03F 7/708; B05D 3/06; B05D 5/00; B22F 7/062; B22F 10/00; B22F 10/20; B22F 10/25; B22F 10/28; B22F 10/66; B23K 26/342; B23K 26/354; B23Q 3/18; B33Y 10/00; B33Y 80/00; Y02P 10/25
See application file for complete search history.

(56) References Cited

U.S. PATENT DOCUMENTS

| | | | |
|---|---|---|---|
| 5,368,947 A | 11/1994 | Denney | |
| 5,583,736 A | 12/1996 | Anderson et al. | |
| 5,663,865 A | 9/1997 | Kawada et al. | |
| 5,838,529 A | 11/1998 | Shufflebotham et al. | |
| 5,885,654 A | 3/1999 | Hagiwara et al. | |
| 6,033,475 A | 3/2000 | Hasebe et al. | |
| 6,046,426 A | 4/2000 | Jeantette et al. | |
| 6,307,620 B1 | 10/2001 | Takabayashi et al. | |
| 6,413,701 B1 | 7/2002 | Van Empel et al. | |
| 6,709,747 B1 | 3/2004 | Gordeev et al. | |
| 6,864,957 B2 | 3/2005 | Van Elp et al. | |
| 7,050,147 B2 | 5/2006 | Compen | |
| 7,078,715 B2 | 7/2006 | Vink et al. | |
| 7,092,231 B2 | 8/2006 | Hoeks et al. | |
| 7,110,085 B2 | 9/2006 | Zaal et al. | |
| 7,119,885 B2 | 10/2006 | Ottens et al. | |
| 7,327,439 B2 | 2/2008 | Zaal et al. | |
| 7,524,735 B1 | 4/2009 | Gauri et al. | |
| 7,649,611 B2 | 1/2010 | Zaal et al. | |
| 7,816,022 B2 | 10/2010 | Ekstein et al. | |
| 7,940,511 B2 | 5/2011 | Sijben | |
| 8,228,487 B2 | 7/2012 | Rijpma et al. | |
| 9,354,528 B2 | 5/2016 | Bex | |
| 9,442,395 B2 | 9/2016 | Lafarre | |
| 9,507,274 B2 | 11/2016 | Lafarre | |
| 10,245,641 B2 | 4/2019 | Lafarre | |
| 10,898,955 B2 | 1/2021 | Lafarre | |
| 11,235,388 B2 | 2/2022 | Lafarre | |
| 11,376,663 B2 | 7/2022 | Lafarre | |
| 11,628,498 B2 * | 4/2023 | Lafarre .................. | G03F 7/707 355/72 |
| 2001/0033369 A1 | 10/2001 | Matsui | |
| 2002/0004105 A1 | 1/2002 | Kunze et al. | |
| 2004/0012767 A1 | 1/2004 | Van Elp et al. | |
| 2004/0055709 A1 | 3/2004 | Boyd, Jr. et al. | |
| 2004/0114124 A1 | 6/2004 | Hoeks et al. | |
| 2004/0160021 A1 | 8/2004 | Tatsumi et al. | |
| 2004/0207824 A1 | 10/2004 | Lof et al. | |
| 2004/0217095 A1 | 11/2004 | Herzog | |
| 2004/0247361 A1 | 12/2004 | Zaal et al. | |
| 2005/0024620 A1 | 2/2005 | Van Empel et al. | |
| 2005/0030512 A1 | 2/2005 | Zaal et al. | |
| 2005/0030515 A1 | 2/2005 | Ottens et al. | |
| 2005/0041364 A1 | 2/2005 | Kellerman et al. | |
| 2005/0045106 A1 | 3/2005 | Boyd et al. | |
| 2005/0061995 A1 | 3/2005 | Vink et al. | |
| 2005/0095776 A1 | 5/2005 | Usuami | |
| 2005/0117141 A1 | 6/2005 | Ottens et al. | |
| 2005/0128444 A1 | 6/2005 | Ottens et al. | |
| 2005/0128459 A1 | 6/2005 | Zwet et al. | |
| 2005/0146694 A1 | 7/2005 | Tokita | |
| 2005/0183669 A1 | 8/2005 | Parkhe et al. | |
| 2005/0195382 A1 | 9/2005 | Ottens et al. | |
| 2005/0248746 A1 | 11/2005 | Zaal et al. | |
| 2006/0006340 A1 | 1/2006 | Compen | |
| 2006/0033898 A1 | 2/2006 | Cadee et al. | |
| 2006/0038968 A1 | 2/2006 | Kemper et al. | |
| 2006/0075969 A1 | 4/2006 | Fischer | |
| 2006/0102277 A1 | 5/2006 | Zaal et al. | |
| 2006/0102849 A1 | 5/2006 | Mertens et al. | |
| 2006/0130750 A1 | 6/2006 | Ishikawa et al. | |
| 2006/0130767 A1 | 6/2006 | Herchen | |
| 2006/0139614 A1 | 6/2006 | Owa et al. | |
| 2007/0017160 A1 | 1/2007 | Caldwell et al. | |
| 2007/0070319 A1 | 3/2007 | Nakamura et al. | |
| 2007/0097346 A1 | 5/2007 | Zaal et al. | |
| 2007/0139855 A1 | 6/2007 | Van Mierlo et al. | |
| 2007/0146679 A1 | 6/2007 | Sutedja et al. | |
| 2007/0217114 A1 | 9/2007 | Sasaki et al. | |
| 2007/0285647 A1 | 12/2007 | Kwan et al. | |
| 2008/0011737 A1 | 1/2008 | Fukuoka et al. | |
| 2008/0024743 A1 | 1/2008 | Kruit et al. | |
| 2008/0043210 A1 | 2/2008 | Shibuta | |
| 2008/0060828 A1 * | 3/2008 | Shibazaki ........... | G03F 7/70941 174/5 SG |
| 2008/0138504 A1 | 6/2008 | Williams | |
| 2008/0158538 A1 | 7/2008 | Puyt et al. | |
| 2008/0212046 A1 | 9/2008 | Riepen et al. | |
| 2008/0276865 A1 | 11/2008 | Nishimizu et al. | |
| 2008/0280536 A1 | 11/2008 | Sasaki et al. | |
| 2009/0079525 A1 | 3/2009 | Sijben | |
| 2009/0122458 A1 | 5/2009 | Lischer | |
| 2009/0142615 A1 | 6/2009 | Ekstein et al. | |
| 2009/0207392 A1 | 8/2009 | Rijpma et al. | |
| 2009/0262318 A1 | 10/2009 | Van Den Dungen et al. | |
| 2009/0279060 A1 | 11/2009 | Direcks et al. | |
| 2009/0279062 A1 | 11/2009 | Direcks et al. | |
| 2009/0284894 A1 | 11/2009 | Cooke | |
| 2010/0039747 A1 | 2/2010 | Sansoni et al. | |
| 2010/0193501 A1 | 8/2010 | Zucker et al. | |
| 2010/0200901 A1 | 8/2010 | Kim | |
| 2010/0214549 A1 | 8/2010 | Cadee et al. | |
| 2011/0036990 A1 | 2/2011 | Stone et al. | |

(56) References Cited

U.S. PATENT DOCUMENTS

| | | |
|---|---|---|
| 2011/0222032 A1 | 9/2011 | Ten Kate et al. |
| 2011/0222033 A1 | 9/2011 | Ten Kate et al. |
| 2011/0292561 A1 | 12/2011 | Kamimura et al. |
| 2012/0013865 A1 | 1/2012 | Laurent et al. |
| 2012/0044609 A1 | 2/2012 | Cooke et al. |
| 2012/0147353 A1 | 6/2012 | Lafarre et al. |
| 2012/0177942 A1 | 7/2012 | Chang et al. |
| 2012/0212725 A1 | 8/2012 | Lafarre et al. |
| 2012/0242271 A1 | 9/2012 | Van Der Toorn et al. |
| 2012/0274920 A1 | 11/2012 | Bex et al. |
| 2013/0094009 A1 | 4/2013 | Lafarre et al. |
| 2013/0164688 A1 | 6/2013 | Cadee et al. |
| 2013/0189802 A1 | 7/2013 | Tromp et al. |
| 2013/0301028 A1 | 11/2013 | Albert |
| 2015/0029485 A1 | 1/2015 | Lafarre |
| 2015/0311108 A1 | 10/2015 | Horiuchi |
| 2016/0111318 A1 | 4/2016 | Ichinose |
| 2018/0130692 A1 | 5/2018 | Ishino |
| 2021/0114101 A1 | 4/2021 | Lafarre |

FOREIGN PATENT DOCUMENTS

| | | |
|---|---|---|
| CN | 1456933 | 11/2003 |
| CN | 1487360 | 4/2004 |
| CN | 1580956 | 2/2005 |
| CN | 1922724 | 2/2007 |
| CN | 101030041 | 9/2007 |
| CN | 101599453 | 12/2009 |
| CN | 101803001 | 8/2010 |
| CN | 102067302 | 5/2011 |
| CN | 102193331 | 9/2011 |
| EP | 0134438 | 4/1992 |
| EP | 1106859 | 6/2001 |
| EP | 1 510 868 | 3/2005 |
| EP | 1650604 | 4/2006 |
| EP | 2317546 | 5/2011 |
| EP | 2 365 390 | 9/2011 |
| EP | 2490073 | 8/2012 |
| EP | 3882700 | 9/2021 |
| JP | H03-187240 | 8/1991 |
| JP | H04-103750 | 4/1992 |
| JP | 5-047909 | 2/1993 |
| JP | H05-205997 | 8/1993 |
| JP | 6-204324 | 7/1994 |
| JP | H07-019831 | 3/1995 |
| JP | 9-92703 | 4/1997 |
| JP | H09-148379 | 6/1997 |
| JP | H09-199574 | 7/1997 |
| JP | 09-270327 | 10/1997 |
| JP | 09-270445 | 10/1997 |
| JP | H09-283605 | 10/1997 |
| JP | 10-64987 | 3/1998 |
| JP | 2000-174105 | 6/2000 |
| JP | 2000-202626 | 7/2000 |
| JP | 2000-311933 | 11/2000 |
| JP | 2001-028333 | 1/2001 |
| JP | 2001-237303 | 8/2001 |
| JP | 3250290 | 11/2001 |
| JP | 2003-518193 | 6/2003 |
| JP | 2004-022859 | 1/2004 |
| JP | 2004-022889 | 1/2004 |
| JP | 2004-531067 | 10/2004 |
| JP | 2005-029401 | 2/2005 |
| JP | 2005-079586 | 3/2005 |
| JP | 2005-328045 | 11/2005 |
| JP | 2006-024954 | 1/2006 |
| JP | 2006-148101 | 6/2006 |
| JP | 2007-503123 | 2/2007 |
| JP | 2007-158309 | 6/2007 |
| JP | 2007-194618 | 8/2007 |
| JP | 2007-201068 | 8/2007 |
| JP | 2007-527625 | 9/2007 |
| JP | 2007-266611 | 10/2007 |
| JP | 2008-028052 | 2/2008 |
| JP | 2008-085129 | 4/2008 |
| JP | 2008-135736 | 6/2008 |
| JP | 2008-160093 | 7/2008 |
| JP | 2008-189956 | 8/2008 |
| JP | 2009-179507 | 8/2009 |
| JP | 2009-200486 | 9/2009 |
| JP | 2009-246302 | 10/2009 |
| JP | 4378053 | 12/2009 |
| JP | 2010-161319 | 7/2010 |
| JP | 2010-165776 | 7/2010 |
| JP | 2010-199581 | 9/2010 |
| JP | 2011-081040 | 4/2011 |
| JP | 2011-521470 | 7/2011 |
| JP | 2011-167768 | 9/2011 |
| JP | 2011-176275 | 9/2011 |
| JP | 2011-192991 | 9/2011 |
| JP | 2011-192992 | 9/2011 |
| JP | 2011-199303 | 10/2011 |
| JP | 2011-530833 | 12/2011 |
| JP | 2012-129524 | 7/2012 |
| JP | 2012-235095 | 11/2012 |
| KR | 2009-0008658 | 1/2009 |
| WO | 99/49504 | 9/1999 |
| WO | 00/000921 | 1/2000 |
| WO | 01/045882 | 6/2001 |
| WO | 2008/047886 | 4/2008 |
| WO | 2008/057483 | 5/2008 |
| WO | 2010/095540 | 8/2010 |
| WO | 2011/051345 | 5/2011 |
| WO | 2011/053145 | 5/2011 |
| WO | 2011/093451 | 8/2011 |
| WO | 2012/005294 | 1/2012 |
| WO | 2013/113568 | 8/2013 |
| WO | 2013/156236 | 10/2013 |
| WO | 2016/164498 | 10/2016 |

OTHER PUBLICATIONS

A. Streek et al., "Laser micro sintering—a quality leap through improvement of powder packing," Laserapplikationszentrum, Fachbereich MPI, Hochschule Mittweida, 12 pages (2008).

S. Kloetzer et al., "Micro-Cladding Using a Pulsed Fibre Laser and Scanner," Proceedings of LPM2010—the 11th International Symposium on Laser Precision Microfabrication, pp. 1-5 (Jun. 2010).

H. Exner et al., "Lasermikrosintern von keramischen Materialien" Laserinstitut Mittelsachsen e.V./Hochschule Mittweida, RTejournal, vol. 3, pp. 1-18, Aug. 3, 2006.

Robby Ebert et al., "Rapid Microtooling With laser-based procedure," Laserinstitut der Hochschule Mittweida, Rapid Micro, pp. 1-223 (2006-2011).

International Preliminary Report on Patentability dated Aug. 14, 2014 in corresponding international Patent Application No. PCT/EP2013/050818.

Japanese Office Action dated Aug. 28, 2015 in corresponding Jaganese Patent Application No. 2014-555139.

Japanese Office Action dated Sep. 2, 2015 in corresponding Japanese Patent Application No. 2014-555140.

U.S. Office Action dated Mar. 25, 2016 in corresponding U.S. Appl. No. 14/373,291.

Japanese Office Action dated May 17, 2016 in corresponding Japanese Patent Application No. 2014-555139.

Notice of Reasons for Rejection issued in corresponding Japanese Patent Application No. 2016-121468, dated May 1, 2017.

Ex parte Quayle Office Action issued in corresponding U.S. Appl. No. 15/296,968, dated Apr. 6, 2017.

Office Action issued in corresponding U.S. Appl. No. 15/654,413 dated Aug. 10, 2017.

Office Action issued in corresponding U.S. Appl. No. 15/654,413 dated Oct. 6, 2017.

Notice of Reasons for Rejection issued in corresponding Japanese Patent Application No. 2016-121468 dated Oct. 3, 2017.

Final Office Action dated Mar. 29, 2018 issued in corresponding U.S. Appl. No. 15/654,413.

Office Action dated Aug. 21, 2018 issued in corresponding EP Patent Application No. 13 700 893.4.

(56) References Cited

OTHER PUBLICATIONS

Office Action dated Nov. 1, 2018 issued in corresponding U.S. Appl. No. 15/654,413.
European Office Action issued in corresponding EP Patent Application No. 13700401.6 dated Nov. 7, 2018.
Notice of Reasons for Rejection dated Jan. 30, 2019 issued in corresponding Japanese Patent Application No. 2018-068277 with English translation.
Extended European Search Report dated Sep. 9, 2019 issued in corresponding European Patent Application No. 19174953.0.
Non-final Office Action dated Sep. 19, 2019 issued in corresponding U.S. Appl. No. 15/654,413.
Final Office Action dated Jan. 2, 2020 issued in corresponding U.S. Appl. No. 15/654,413.
Office Action dated Apr. 1, 2020 issued in corresponding Chinese Patent Application No. 201811239416.3.
Office Action dated May 7, 2020 issued in corresponding Chinese Patent Application No. 201811326560.0 with English translation.
Search Report dated Jun. 23, 2020 issued in corresponding EP Application No. 20160382.6.
Office Action dated Oct. 6, 2020 issued in corresponding Japanese Patent Application No. 2019-194121 with English translation.
Office Action dated Nov. 2, 2020 issued in corresponding Chinese Patent Application No. 201811326560.0 with English translation.
U.S. Final Office Action issued in corresponding U.S. Appl. No. 15/654,413, dated May 15, 2019.
Office Action dated Feb. 2, 2021, issued in corresponding Chinese Patent Application No. 201811325912.0 with English translation (9 pgs.).
Office Action dated Jan. 29, 2021, issued in corresponding Chinese Patent Application No. 2018112394163 with English translation (21 pgs.).
Office Action dated Jun. 20, 2022, issued in corresponding Chinese Patent Application No. 201811325912.0 with English translation (21 pgs.).
Office Action dated Sep. 15, 2022, issued in corresponding European Patent Application No. 20160382.6 (8 pgs.).
Notice of Reasons for Refusal dated Apr. 19, 2022, issued in corresponding Japanese Patent Application No. 2021-078268 with English translation (4 pgs.).
Office Action dated Dec. 23, 2021, issued in corresponding Chinese Patent Application No. 201811325912.0 with English translation (19 pgs.).

\* cited by examiner

-- PRIOR ART --

-- PRIOR ART --

-- PRIOR ART --

-- PRIOR ART --

-- PRIOR ART --

SUBSTRATE HOLDER, LITHOGRAPHIC APPARATUS, DEVICE MANUFACTURING METHOD, AND METHOD OF MANUFACTURING A SUBSTRATE HOLDER

CROSS-REFERENCE TO RELATED APPLICATIONS

This application is a continuation of co-pending U.S. patent application Ser. No. 17/587,236, which was filed on Jan. 28, 2022, which is a continuation of U.S. patent application Ser. No. 17/138,480, which was filed on Dec. 30, 2020, now U.S. Pat. No. 11,235,388, which is a continuation of U.S. patent application Ser. No. 16/369,368, which was filed on Mar. 29, 2019, now U.S. Pat. No. 10,898,955, which is a continuation of U.S. patent application Ser. No. 15/261,553, which was filed Sep. 9, 2016, now U.S. Pat. No. 10,245,641, which is a continuation of U.S. patent application Ser. No. 14/374,197, which was filed on Jul. 23, 2014, now U.S. Pat. No. 9,442,395, which is the U.S. national phase entry of PCT Patent Application No. PCT/EP2013/050818, which was filed on Jan. 17, 2013, which claims the benefit of priority of U.S. provisional application No. 61/594,857, which was filed on Feb. 3, 2012, U.S. provisional application No. 61/621,648, which was filed on Apr. 9, 2012 and U.S. provisional application No. 61/621,660, which was filed on Apr. 9, 2012, each of the foregoing applications is are incorporated herein in its entirety by reference.

FIELD

The present invention relates to a substrate holder, a lithographic apparatus, a device manufacturing method, and a method of manufacturing a substrate holder.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

SUMMARY

In a conventional lithography apparatus, the substrate to be exposed may be supported by a substrate holder which in turn is supported by a substrate table. The substrate holder is often a flat rigid disc corresponding in size and shape to the substrate (although it may have a different size or shape). It has an array of projections, referred to as burs or pimples, projecting from at least one side. In an embodiment, the substrate holder has an array of projections on two opposite sides. In this case, when the substrate holder is placed on the substrate table, the main body of the substrate holder is held a small distance above the substrate table while the ends of the buds on one side of the substrate holder lie on the surface of the substrate table. Similarly, when the substrate rests on the top of the burls on the opposite side of the substrate holder, the substrate is spaced apart from the main body of the substrate holder. One purpose of this is to help prevent a particle (i.e. a contaminating particle such as a dust particle) which might be present on either the substrate table or substrate holder from distorting the substrate holder or the substrate. Since the total surface area of the burs is only a small fraction of the total area of the substrate or substrate holder, it is highly probable that any particle will lie between burls and its presence will have no effect.

Due to the high accelerations experienced by the substrate in use of a high-throughput lithographic apparatus, it is not sufficient to allow the substrate simply to rest on the burls of the substrate holder. It is clamped in place. Two methods of clamping the substrate in place are known—vacuum clamping and electrostatic clamping. In vacuum clamping, the space between the substrate holder and substrate and optionally between the substrate table and substrate holder are partially evacuated so that the substrate is held in place by the higher pressure of gas or liquid above it. Vacuum clamping however may not be feasible where the beam path and/or the environment near the substrate or substrate holder is kept at a low or very low pressure, e.g. for extreme ultraviolet (EUV) radiation lithography. In this case, it may not be possible to develop a sufficiently large pressure difference across the substrate (or substrate holder) to clamp it. Electrostatic clamping can therefore be used in such a circumstance (or in other circumstances). In electrostatic clamping, an electrode provided on the substrate table and/or substrate holder is raised to a high potential, e.g. 10 to 5000 V, and electrostatic forces attract the substrate. Thus another purpose of the burls is to space the substrate, substrate holder and substrate table apart in order to enable electrostatic clamping.

Temperature control over the substrate surface is significant, in particular in immersion systems which are sensitive to temperature variations due to liquid (e.g. water) evaporation effects. Evaporation of liquid removes heat from the substrate, causing temperature variations. These temperature variations may lead to thermal stress in the substrate which eventually may contribute to overlay error. To improve accuracy of temperature control, real time local measurement of the temperature combined with active heating is desired. Such a measurement and heating system is integrated into the system, e.g. in the substrate holder (i.e. the object that directly supports a substrate) and/or substrate table (mirror block of stage, i.e. the object that supports the substrate holder and provides the upper surface surrounding the substrate holder). A thin-film stack can be used to make a structure that can both measure and heat such a structure and offers the opportunity for integration into the substrate holder and/or table.

It is desirable, for example, to provide a substrate table or substrate holder on which one or more electronic or electric components, such as one or more thin-film components, are formed.

According to an aspect of the invention, there is provided a substrate holder for use in a lithographic apparatus, the substrate holder comprising: a main body having a surface; a thin-film stack provided on the surface and forming an electronic or electric component; and a plurality of burls provided on the thin-film stack and having end surfaces to support a substrate.

According to an aspect of the present invention, there is provided a lithographic apparatus, comprising: a support structure configured to support a patterning device; a projection system arranged to project a beam patterned by the patterning device onto a substrate; and a substrate holder arranged to hold the substrate, the substrate holder being as described herein.

According to an aspect of the present invention, there is provided a device manufacturing method using a lithographic apparatus, the method comprising: projecting a beam patterned by a patterning device onto a substrate while holding the substrate in a substrate holder, wherein the substrate holder comprises: a main body having a surface; a thin-film stack provided on the surface and forming an electronic or electric component; and a plurality of burs provided on the thin-film stack and having end surfaces to support a substrate.

According to an aspect of the present invention, there is provided a method of manufacturing a substrate holder for use in a lithographic apparatus, the method comprising: providing a main body having a surface; forming a thin-film stack on the surface of the main body; and forming a plurality of burls on the thin-film stack projecting from the surface and having end surfaces to support a substrate.

According to an aspect of the present invention, there is provided a method of manufacturing a substrate holder for use in a lithographic apparatus, the method comprising: providing a main body having a surface; forming a thin-film stack on the surface of the main body; forming a plurality of apertures in the thin-film stack; and forming a plurality of burs in the apertures of the thin-film stack, the burs projecting from the stack and having end surfaces to support a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
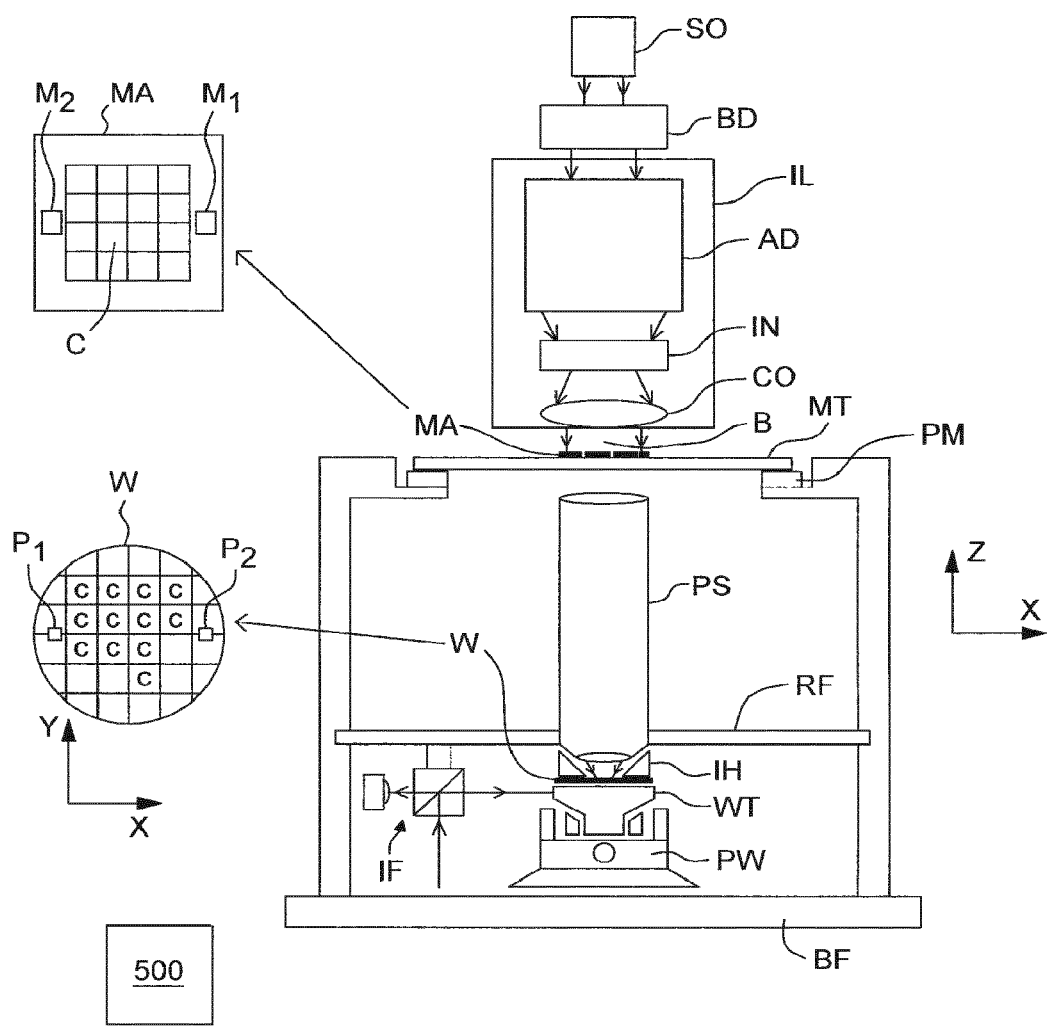
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation, DUV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device".

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The terms "projection system" used herein should be broadly interpreted as encompassing any type of system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more substrate support structures, such as substrate stages or substrate tables, and/or two or more support structures for patterning devices. In an apparatus with multiple substrate stages, all the substrate stages can be equivalent and interchangeable. In an embodiment, at least one of the multiple substrate stages is particularly adapted for exposure steps and at least one of the multiple substrate stages is particularly adapted for measurement or preparatory steps. In an embodiment of the invention one or more of the multiple substrate stages is replaced by a measurement stage. A measurement stage includes at least part one or more sensor systems such as a sensor detector and/or target of the sensor system but does not support a substrate. The measurement stage is positionable in the projection beam in place of a substrate stage or a support structure for a patterning device. In such apparatus the additional stages may be used in parallel, or preparatory steps may be carried out on one or more stages while one or more other stages are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. Substrate W is held on the substrate table WT by a substrate holder according to an embodiment of the present invention and described further below. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In many lithographic apparatuses, a fluid, in particular a liquid, is provided between the final element of the projection system using a liquid supply system IH to enable imaging of smaller features and/or increase the effective NA of the apparatus. An embodiment of the invention is described further below with reference to such an immersion apparatus, but may equally be embodied in a non-immersion apparatus. Arrangements to provide liquid between a final element of the projection system and the substrate can be classed into at least two general categories. These are the bath type arrangement and the so called localized immersion system. In the bath type arrangement substantially the whole of the substrate and optionally part of the substrate table is submersed in a bath of liquid. The localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area. Another arrangement, to which an embodiment of the invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin-film, of liquid on the substrate.

Four different types of localized liquid supply systems are illustrated in FIGS. 2 to 5. Any of the liquid supply devices of FIGS. 2 to 5 may be used in an unconfined system; however, sealing features are not present, are not activated, are not as efficient as normal or are otherwise ineffective to seal liquid to only the localized area.

Figure 2:
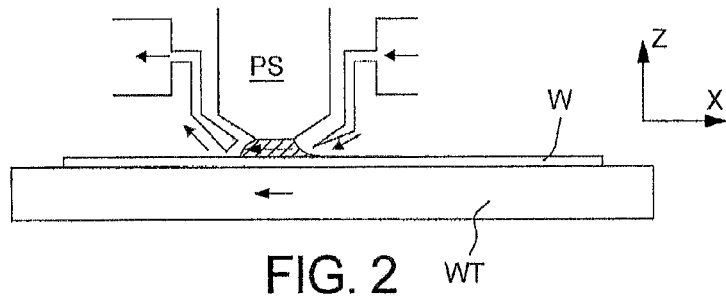
FIGS. 2 and 3 depict a liquid supply system for use in a lithographic projection apparatus.
Figure 3:
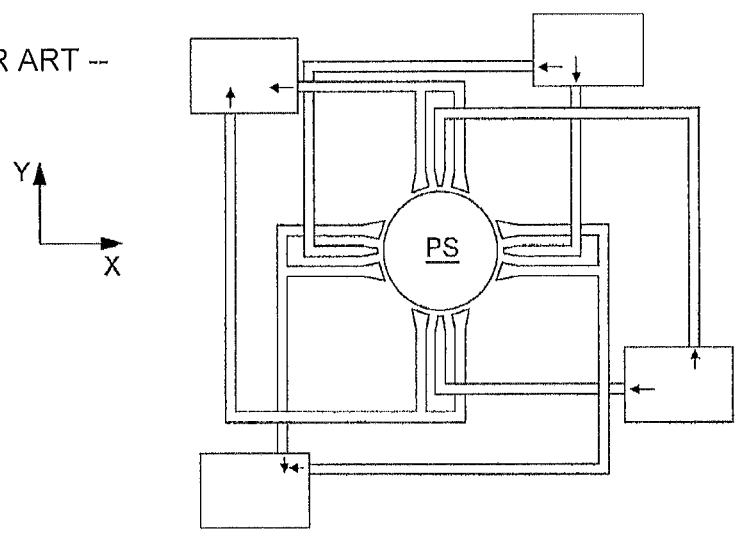

One of the arrangements proposed for a localized immersion system is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate, desirably along the direction of movement of the substrate relative to the final element, and is removed by at least one outlet after having passed under the projection system. That is, as the substrate is scanned beneath the element in a −X direction, liquid is supplied at the +X side of the element and taken up at the −X side.

FIG. 2 shows the arrangement schematically in which liquid is supplied via inlet and is taken up on the other side of the element by outlet which is connected to a low pressure source. The arrows above the substrate W illustrate the direction of liquid flow, and the arrow below the substrate W illustrates the direction of movement of the substrate table. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

Figure 4:
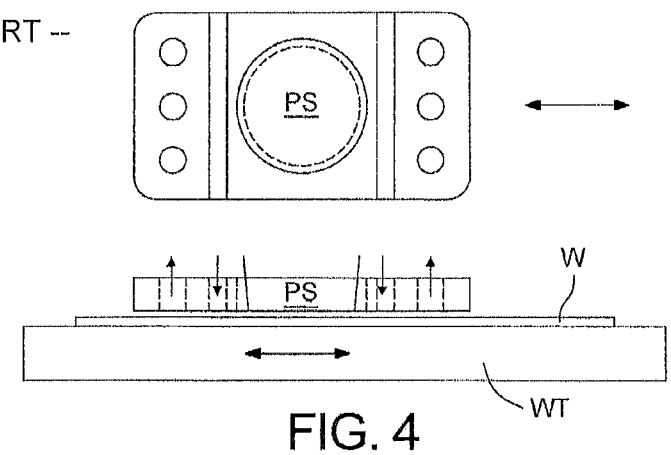
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and outlets can be arranged in a plate with a hole in its center and through which the projection beam is projected. Liquid is supplied by one groove inlet on one side of the projection system PS and removed by a plurality of discrete outlets on the other side of the projection system PS, causing a flow of a thin-film of liquid between the projection system PS and the substrate W. The choice of which combination of inlet and outlets to use can depend on the direction of movement of the substrate W (the other combination of inlet and outlets being inactive). In the cross-sectional view of FIG. 4, arrows illustrate the direction of liquid flow in to inlets and out of outlets.

Figure 5:
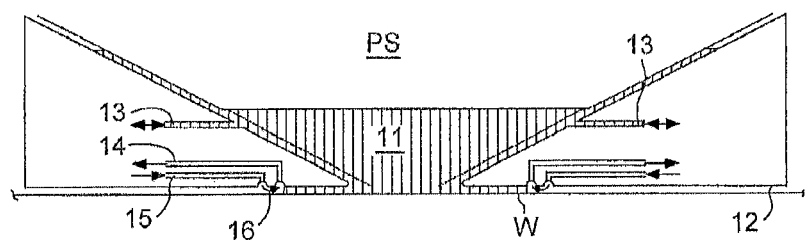
FIG. 5 depicts, in cross-section, a barrier member which may be used in an embodiment of the present invention as an immersion liquid supply system.

Another arrangement which has been proposed is to provide the liquid supply system with a liquid confinement member which extends along at least a part of a boundary of the space between the final element of the projection system and the substrate table. Such an arrangement is illustrated in FIG. 5. The liquid confinement member is substantially stationary relative to the projection system in the XY plane, though there may be some relative movement in the Z direction (in the direction of the optical axis). A seal is formed between the liquid confinement member and the surface of the substrate. In an embodiment, a seal is formed between the liquid confinement member and the surface of the substrate and may be a contactless seal such as a gas seal. Such a system is disclosed in United States patent application publication no. US 2004-0207824.

The fluid handling structure 12 includes a liquid confinement member and at least partly contains liquid in the space 11 between a final element of the projection system PS and the substrate W. A contactless seal 16 to the substrate W may be formed around the image field of the projection system so that liquid is confined within the space between the substrate W surface and the final element of the projection system PS. The space is at least partly formed by the fluid handling structure 12 positioned below and surrounding the final element of the projection system PS. Liquid is brought into the space below the projection system and within the fluid handling structure 12 by liquid inlet 13. The liquid may be removed by liquid outlet 13. The fluid handling structure 12 may extend a little above the final element of the projection system. The liquid level rises above the final element so that a buffer of liquid is provided. In an embodiment, the fluid handling structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

In an embodiment, the liquid is contained in the space 11 by a gas seal 16 which, during use, is formed between the bottom of the fluid handling structure 12 and the surface of the substrate W. The gas seal is formed by gas, e.g. air, synthetic air, $N_2$ or another inert gas. The gas in the gas seal is provided under pressure via inlet 15 to the gap between fluid handling structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid handling structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824.

The example of FIG. 5 is a localized area arrangement in which liquid is only provided to a localized area of the top surface of the substrate W at any one time. Other arrangements are possible, including fluid handling systems which make use of a single phase extractor or a two phase extractor as disclosed, for example, in United States patent application publication no US 2006-0038968.

Another arrangement which is possible is one which works on a gas drag principle. The so-called gas drag principle has been described, for example, in United States patent application publication nos. US 2008-0212046, US 2009-0279060, and US 2009-0279062. In that system the extraction holes are arranged in a shape which desirably has a corner. The corner may be aligned with the stepping or scanning directions. This reduces the force on the meniscus between two openings in the surface of the fluid handling structure for a given speed in the step or scan direction compared to a fluid handling structure having two outlets aligned perpendicular to the direction of scan.

Also disclosed in US 2008-0212046 is a gas knife positioned radially outside the main liquid retrieval feature. The gas knife traps any liquid which gets past the main liquid retrieval feature. Such a gas knife may be present in a so called gas drag principle arrangement (as disclosed in US 2008-0212046), in a single or two phase extractor arrangement (such as disclosed in United States patent application publication no. US 2009-0262318) or any other arrangement.

Many other types of liquid supply system are possible. The present invention is neither limited to any particular type of liquid supply system, nor to immersion lithography. The invention may be applied equally in any lithography. In an EUV lithography apparatus, the beam path is substantially evacuated and immersion arrangements described above are not used.

A control system 500 shown in FIG. 1 controls the overall operations of the lithographic apparatus and in particular performs an optimization process described further below. Control system 500 can be embodied as a suitably-programmed general purpose computer comprising a central processing unit and volatile and non-volatile storage. Optionally, the control system may further comprise one or more input and output devices such as a keyboard and screen, one or more network connections and/or one or more interfaces to the various parts of the lithographic apparatus. It will be appreciated that a one-to-one relationship between controlling computer and lithographic apparatus is not necessary. In an embodiment of the invention one computer can control multiple lithographic apparatuses. In an embodiment of the invention, multiple networked computers can be used to control one lithographic apparatus. The control system 500 may also be configured to control one or more associated process devices and substrate handling devices in a lithocell or cluster of which the lithographic apparatus forms a part. The control system 500 can also be configured to be subordinate to a supervisory control system of a lithocell or cluster and/or an overall control system of a fab.

Figure 6:
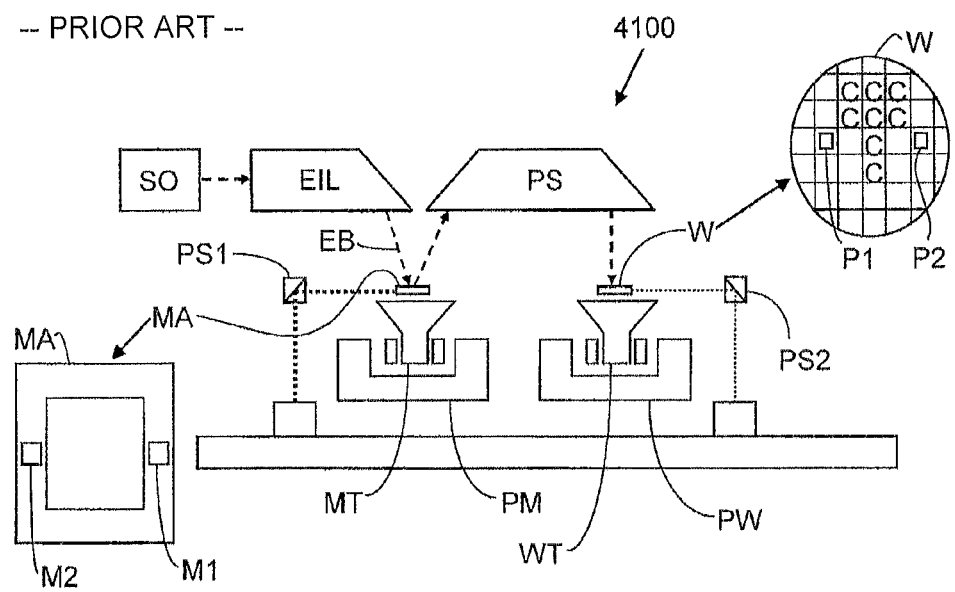
FIG. 6 depicts a lithographic apparatus according to an embodiment of the invention.

FIG. 6 schematically depicts an EUV lithographic apparatus 4100 including a source collector apparatus SO. The apparatus comprises:
- an illumination system (illuminator) EIL configured to condition a radiation beam B (e.g. EUV radiation);
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist-coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

These basic components of the EUV lithographic apparatus are similar in function to the corresponding components of the lithographic apparatus of FIG. 1. The description below mainly covers areas of difference and duplicative description of aspects of the components that are the same is omitted.

In an EUV lithographic apparatus, it is desirable to use a vacuum or low pressure environment since gases can absorb too much radiation. A vacuum environment can therefore be provided to the whole beam path with the aid of a vacuum wall and one or more vacuum pumps.

Referring to FIG. 6, the EUV illuminator EIL receives an extreme ultra violet radiation beam from the source collector apparatus SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the desired line-emitting element, with a laser beam. The source collector apparatus SO may be part of an EUV radiation system including a laser, not shown in FIG. 6, to provide the laser beam exciting the fuel. The resulting plasma emits output radiation, e.g., EUV radiation, which is collected using a radiation collector, disposed in the source collector apparatus. The laser and the source collector apparatus may be separate entities, for example when a $CO_2$ laser is used to provide the laser beam for fuel excitation.

In such cases, the laser is not considered to form part of the lithographic apparatus and the radiation beam is passed from the laser to the source collector apparatus with the aid of a beam delivery system comprising, for example, suitable directing mirrors and/or a beam expander. In other cases the source may be an integral part of the source collector apparatus, for example when the source is a discharge-produced plasma EUV generator, often termed as a DPP source.

The EUV illuminator EIL may comprise an adjuster to adjust the angular intensity distribution of the radiation beam EB. Generally, at least the outer and/or inner radial extent (commonly referred to as σ-outer and σ-inner, respectively) of the intensity distribution in a pupil plane of the illuminator can be adjusted. In addition, the EUV illuminator EIL may comprise various other components, such as facetted field and pupil mirror devices. The EUV illuminator EIL may be used to condition the radiation beam EB, to have a desired uniformity and intensity distribution in its cross section.

The radiation beam EB is incident on the patterning device (e.g., mask) MA, which is held on the support structure (e.g., mask table) MT, and is patterned by the patterning device. After being reflected from the patterning device (e.g. mask) MA, the radiation beam EB passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam EB. Similarly, the first positioner PM and another position sensor PS1 can be used to accurately position the patterning device (e.g. mask) MA with respect to the path of the radiation beam EB. Patterning device (e.g. mask) MA and substrate W may be aligned using mask alignment marks M1, M2 and substrate alignment marks P1, P2.

The depicted apparatus could be used the same modes as the apparatus of FIG. 1.

Figure 7:
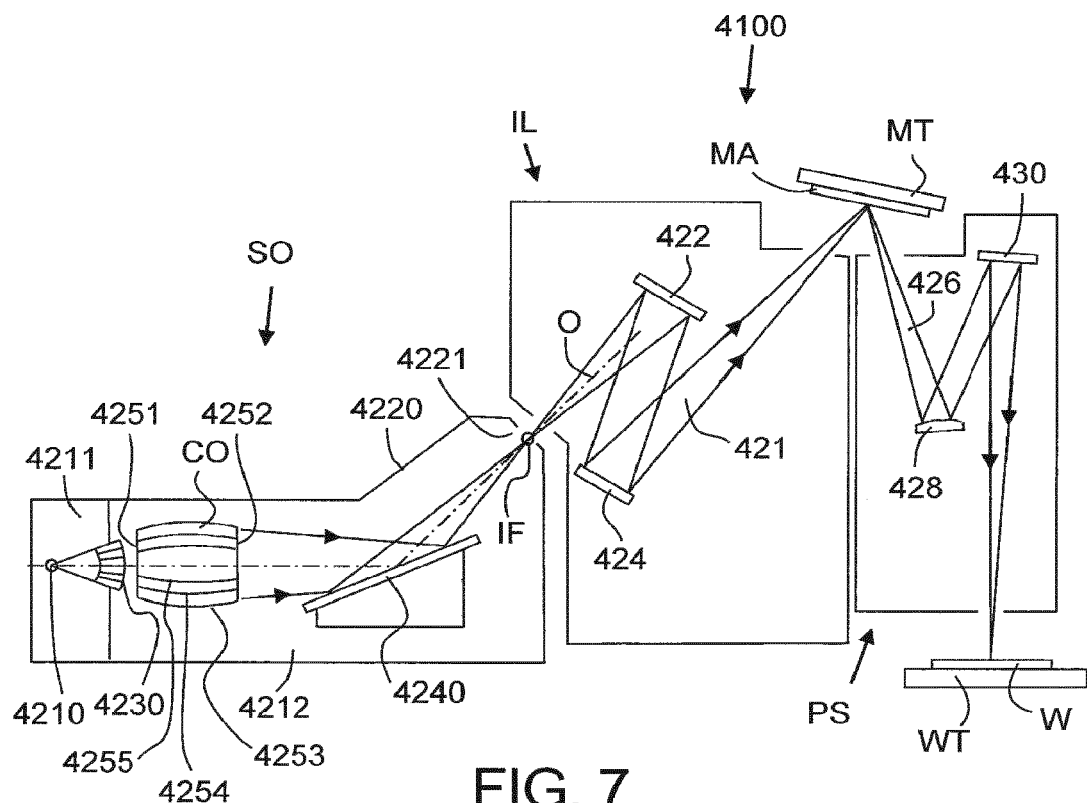
FIG. 7 is a more detailed view of the apparatus 4100.

FIG. 7 shows the EUV apparatus 4100 in more detail, including the source collector apparatus SO, the EUV illumination system EIL, and the projection system PS. The source collector apparatus SO is constructed and arranged such that a vacuum environment can be maintained in an enclosing structure 4220 of the source collector apparatus SO. An EUV radiation emitting plasma 4210 may be formed by a discharge produced plasma source. EUV radiation may be produced by a gas or vapor, for example Xe gas, Li vapor or Sn vapor in which the plasma 4210 is created to emit radiation in the EUV range of the electromagnetic spectrum. The plasma 4210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the plasma 4210 is passed from a source chamber 4211 into a collector chamber 4212 via an optional gas barrier and/or contaminant trap 4230 (in some cases also referred to as contaminant barrier or foil trap) which is positioned in or behind an opening in source chamber 4211. The contaminant trap 4230 may include a channel structure. Contamination trap 4230 may also include a gas barrier or a combination of a gas barrier and a channel structure. The contaminant trap or contaminant barrier 4230 further indicated herein at least includes a channel structure, as known in the art.

The collector chamber 4212 may include a radiation collector CO which may be a so-called grazing incidence collector. Radiation collector CO has an upstream radiation collector side 4251 and a downstream radiation collector side 4252. Radiation that traverses collector CO can be reflected by a grating spectral filter 4240 to be focused in a virtual source point IF. The virtual source point IF is commonly referred to as the intermediate focus, and the source collector apparatus is arranged such that the intermediate focus IF is located at or near an opening 4221 in the enclosing structure 4220. The virtual source point IF is an image of the radiation emitting plasma 4210.

Subsequently the radiation traverses the illumination system IL, which may include a facetted field mirror device 422 and a facetted pupil mirror device 424 arranged to provide a desired angular distribution of the radiation beam 421, at the patterning device MA, as well as a desired uniformity of radiation intensity at the patterning device MA. Upon reflection of the beam of radiation 421 at the patterning device MA, held by the support structure MT, a patterned beam 426 is formed and the patterned beam 426 is imaged by the projection system PS via reflective elements 428, 430 onto a substrate W held by the substrate stage or substrate table WT.

More elements than shown may generally be present in illumination optics unit IL and projection system PS. The grating spectral filter 4240 may optionally be present, depending upon the type of lithographic apparatus. There may be more mirrors present than those shown in the Figures, for example there may be from 1 to 6 additional reflective elements present in the projection system PS than shown in FIG. 7.

Collector optic CO, as illustrated in FIG. 7, is depicted as a nested collector with grazing incidence reflectors 4253, 4254 and 4255, just as an example of a collector (or collector mirror). The grazing incidence reflectors 4253, 4254 and 4255 are disposed axially symmetric around an optical axis O and a collector optic CO of this type is preferably used in combination with a discharge produced plasma source, often called a DPP source.

Figure 8:
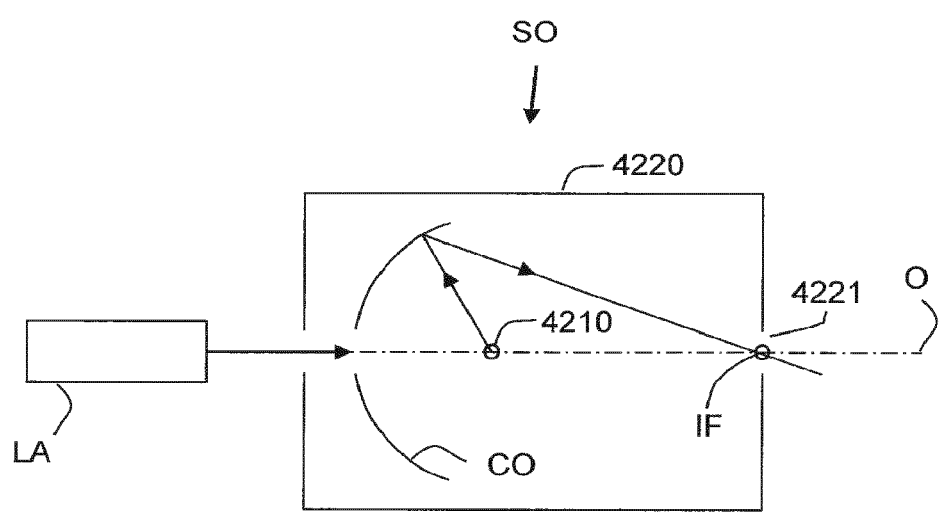
FIG. 8 is a more detailed view of the source collector apparatus SO of the apparatus of FIGS. 6 and 7.

Alternatively, the source collector apparatus SO may be part of an LPP radiation system as shown in FIG. 8. A laser LA is arranged to deposit laser energy into a fuel, such as xenon (Xe), tin (Sn) or lithium (Li), creating the highly ionized plasma 4210 with electron temperatures of several 10's of eV. The energetic radiation generated during de-excitation and recombination of these ions is emitted from the plasma, collected by a near normal incidence collector optic CO and focused onto the opening 4221 in the enclosing structure 4220.

Figure 9:
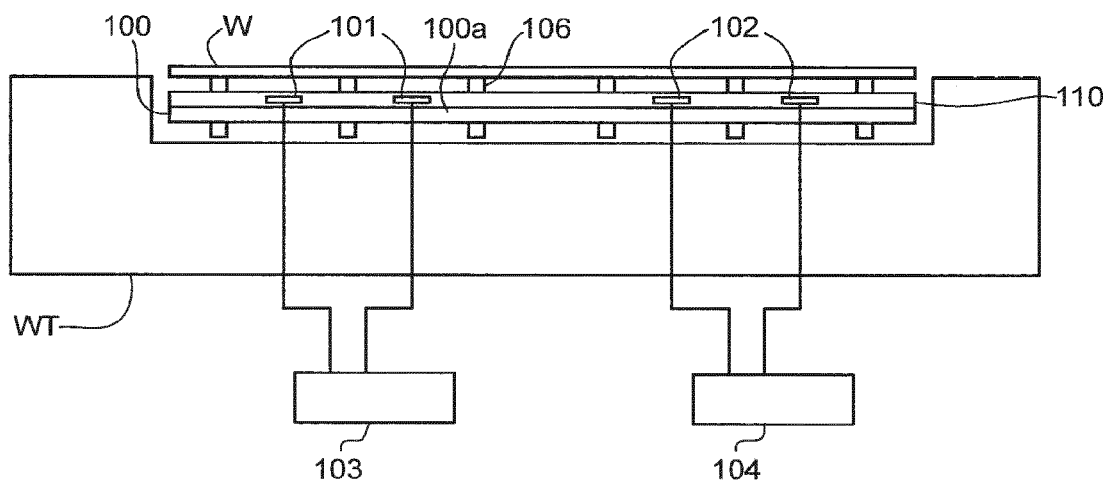
FIG. 9 depicts in cross-section a substrate table and a substrate holder according to an embodiment of the invention.

FIG. 9 depicts a substrate holder according to an embodiment of the invention. It may be held within a recess in substrate table WT and supports substrate W. The main body of the substrate holder 100 has the form of a flat plate, for example a disc substantially corresponding in shape and size to the substrate W. At least on a top side, in an embodiment on both sides, the substrate holder has projections 106, commonly referred to as burls. In an embodiment, the substrate holder is an integral part of the substrate table and does not have burs on the lower surface. The burs are not shown to scale in FIG. 9.

In a practical embodiment, there can be many hundreds or thousands of burls, e.g. more than 10,000 or more than 40,000 burls, distributed across a substrate holder. e.g., of width (e.g., diameter) 200 mm, 300 mm or 450 mm. The tips of the burls have a small area, e.g. less than 1 mm$^2$. Thus the total area of all of the burs on one side of the substrate holder 100 is less than about 10%, e.g. 1-3% of the total area of the total surface area of the substrate holder. Because of the burl arrangement, there is a high probability that any particle that might lie on the surface of the substrate, substrate holder or substrate table will fall between buds and will not therefore result in a deformation of the substrate or substrate holder.

The burl arrangement may form a pattern and/or may have a periodic arrangement. The burl arrangement can be regular or can vary as desired to provide appropriate distribution of force on the substrate W and substrate table WT. The buds can have any shape in plan but are commonly circular in plan. The burls can have the same shape and dimensions throughout their height but are commonly tapered. The distance that the buds project from the rest of the surface of the main body 100*a* of the substrate holder 100 is from about 1 μm to about 5 mm, desirably from about 5 μm to about 250 μm, from the rest of the surface of the main body 100*a* of the substrate holder 100. The thickness of the main body 100*a* of the substrate holder 100 can be in the range of about 1 mm to about 50 mm, desirably in the range of about 5 mm to 20 mm, typically 10 mm.

In an embodiment of the invention, an upper surface of substrate holder 100 is a smooth and flat initial surface for the formation of a thin-film stack and a burl arrangement. In an embodiment, the upper surface of substrate holder 100 is polished to form the smooth surface. In an embodiment, before applying a thin film layer as described herein, as described in U.S. patent application No. U.S. 61/576,627 filed on 16 Dec. 2011, which is hereby incorporated by reference in its entirety, one or more techniques may be applied to smooth the surface of the substrate holder 100 to provide a surface on which a thin film layer may be reliably be applied. See also U.S. patent application no. U.S. Ser. No. 13/323,520, filed 12 Dec. 2011, which is hereby incorporated by reference in its entirety, which refers to application of a planarization layer over the surface. In an embodiment, planarization (e.g., having a planarization layer, polishing, etc.) is not necessary before burl formation as described herein. An embodiment of the present invention obviates planarization, for example where planarization might have been used to smooth a roughened surface which is roughened during a material removal process to form burls integral with the substrate support. An embodiment of the invention may use an uncoated smooth planar object on which the burs are directly deposited. The surface can be smooth because it is planar and may, in an embodiment, be polished before burl fabrication.

The substrate holder surface may, for example, be formed from SiC, SiSiC, Zerodur, Cordierite, or some other suitable ceramic or glass-ceramic material. An isolation layer is then deposited onto the substrate holder surface as a thin-film. The isolation layer may be any suitable insulator. A conductive, e.g. metal, pattern is then deposited onto the isolation layer. The metal pattern may, for example, comprise one or more thin-film temperature sensors and/or heaters, and/or may comprise a thin-film electrostatic clamp. The conductive pattern may be formed, for example, using lithography and etching, inkjet printing or any other suitable method. An isolation layer is then deposited onto the conductive pattern as a thin-film, thereby providing a smooth layer of isolation material. Following this, material which is used to form buds is provided on the isolation layer. The burl material is patterned and etched (e.g. using a lithography and etching technique), thereby forming a set of buds in a desired arrangement or pattern. Further methods of forming the buds are described below. Various methods to form the burls can be used. Generally the manner of formation of the buds can be determined by suitable inspection of the completed substrate holder.

The above method may be used to provide one or more thin-film temperature sensors and/or heaters and/or a film for an electrostatic clamp, and in addition provide burs, on a substrate holder in a unitary manner as a multi-layer structure. The method may be beneficial for at least one of the following reasons.

It avoids the need to remove material from a blank to form the burls and therefore it may not be necessary to provide a planarization layer to form a flat surface for formation of the thin-film stack. The layers are applied on a smooth initial surface of the substrate holder 100.

The thickness of the deposited layers is well controlled during the deposition. Therefore, in an embodiment having one or more sensors and/or heaters, the separation between a thin-film temperature sensor and/or heater and the substrate W is well controlled and consistent. This means that the temperature can be accurately measured by the thin-film temperature sensor.

The method allows thin-film temperature sensors to be provided across the surface of the substrate holder/table. Therefore, the temperature of the substrate W can be measured at a plurality of locations across the substrate W. A similar advantage can exist for thin-film heaters, namely that they can be used to provide heating at a plurality of locations across the substrate W. Therefore, they can provide more accurate heating than conventional heaters. The combination of thin-film sensors and thin-film heaters allows real-time measurement and control of the substrate temperature to be achieved.

In an embodiment having an electrostatic clamp, the separation between the thin-film electrostatic clamp and the substrate is well controlled and consistent so that the clamping force applied by the electrostatic clamp is more consistent (compared with the force that would be applied if the separation between the electrostatic clamp and a substrate was less well controlled). This is beneficial because non-uniformity in the clamping force applied to the substrate should be avoided, since non-uniformity of the clamping force could cause distortion of the substrate.

So-called pin-holes or cracks, such as breaks in the crystalline structure of a thin-film known as dislocations, might arise in a thin-film layer, e.g. an isolation layer of an electrostatic clamp. Such faults might give rise to reduced performance or failure of a component in the thin-film stack, e.g. poor isolation. In an embodiment, this may beneficially be avoided by providing the isolation layer as several thin layers stacked together, such that pin-holes or cracks in a particular isolation layer are at least partially filled in when the next isolation layer is deposited. The probability of a fault in one layer overlapping a fault in another layer is small.

Beneficially, the buds may be formed with very consistent dimensions, in particular so that the variation between heights of different burs is very small. Short burs can be formed (e.g. shorter than 20 μm, shorter than 15 μm, shorter than 5 μm or shorter than 3 μm). Shorter burs are beneficial because they increase the heat transfer between the substrate and the substrate holder. The gap between the top of the substrate holder away from the burls and the supported surface of a substrate on the substrate holder is smaller than a support with a greater height. Such a small gap facilitates the transfer of heat from a temperature conditioning element (e.g., heater) to the supported substrate. The minimum burl height is determined by the variations in the total height of the thin-film stack and the amount of unflatness of the substrate and substrate holder. In an embodiment the burl height is greater than or equal to 1 μm or 2 μm.

The burls can have a width (e.g., diameter) less than or equal to 0.5 mm. In an embodiment the burs have a width (e.g., diameter) in the range of from about 250 μm to about 500 μm. The spacing between burls is between about 1.5 mm to about 3 mm.

Beneficially, an embodiment of the present invention enables that the arrangement of components in the thin-film stack is not constrained by the position of the buds. Greater design freedom may be therefore provided than if the components must be placed around the burls, for example if the buds are present on the substrate holder before a thin-film layer of the electrical device is formed. If it is desired to ground a burl, in an embodiment of the invention, a conductor, e.g. a via can be provided in the top isolation layer in the thin-film stack to connect the burl to a grounding line. Additionally, or alternatively, one or more grounding lines can be provided on top of the thin-film stack.

Further, an embodiment of the invention allows use of a wider range of materials for the substrate holder. Materials that are not suitable for previous methods of forming buds or substrate holders can be used in an embodiment of the invention. In an embodiment, it is possible to use material such as cordierite, a low CTE glass-ceramic, which cannot easily be machined to form burls. Cordierite has good properties, such as a high Young's modulus of about 125 Gpa and low thermal conductivity of about 3 W/mK, for use in a substrate holder.

A substrate holder manufactured according to an embodiment of the invention can have a long usable life time due to robust manufacturing methods. An embodiment of the invention can exhibit desirable wear properties, for example good wear resistance and therefore low generation of particular contaminants. Beneficially, an embodiment of the invention can avoid the need for coating the substrate holder.

A thin-film component may have a layer thickness in the range of from about 2 nm to about 100 μm. Such a thin film component may have one or a plurality of layers. Each layer may be formed by a process including chemical vapor deposition, physical vapor deposition (e.g. sputtering), dip coating, spin coating and/or spray coating. In an embodiment, a component formed on the substrate holder comprises a thin-film stack, i.e. including a plurality of thin-film layers. Such components are described further below.

Although reference in this description is to a thin film stack formed on the top surface of a substrate holder, the thin film stack may be formed on the undersurface of the substrate holder, or on a substrate table beneath a substrate holder, or on any other surface of the substrate table or substrate holder, including a surface of an integral substrate holder and substrate table.

An electronic or electric component to be formed on the substrate table can include, for example, an electrode, a resistive heater and/or a sensor, such as (in a non-limiting list) a strain sensor, a magnetic sensor, a pressure sensor, a capacitive sensor or a temperature sensor. A heater and sensor can be used to locally control and/or monitor the temperature of the substrate holder and/or substrate so as to reduce undesired or induced desired temperature variation and stress in the substrate holder or substrate. Desirably, the heater and sensor are formed on, around and/over the same region as each other. It is desirable to control temperature and/or stress of the substrate in order to reduce or eliminate imaging errors such as overlay errors due to local expansion or contraction of the substrate. For example, in an immersion lithography apparatus, evaporation of residual immersion liquid (e.g., water) on the substrate can cause localized cooling, may apply a heat load to the surface on which the liquid is located, and hence shrinkage of the substrate. Conversely, the energy delivered to the substrate by the projection beam during exposure can cause significant heating and therefore expansion of the substrate.

In an embodiment, the component to be formed is an electrode for an electrostatic clamp. In electrostatic clamping, an electrode provided on the substrate table and/or substrate holder is raised to a high potential, e.g. from 10 to 5,000 V. The substrate can be grounded or floating. Electrostatic forces in the electric field generated by the electrode attract the substrate to the substrate table and/or holder to provide a clamping force. This is described further below.

One or more electrical connections can be provided to connect the electric or electronic component on the substrate holder to a voltage source (not shown for convenience). If the component is an electrostatic clamp, the electrode on the substrate has an electrical connection to the voltage source. The component may be on a top surface of the substrate support. At least part of the electrical connection may pass through the body of the substrate support as described in U.S. patent application No. U.S. 61/555,359, filed on 3 Nov. 2011, which is hereby incorporated by reference in its entirety.

In an embodiment, one or more localized heaters 101 are controlled by controller 103 to provide a desired amount of heat to the substrate holder 100 and substrate W to control the temperature of the substrate W. One or more temperature sensors 102 are connected to controller 104 which monitors the temperature of the substrate holder 100 and/or substrate W. Arrangements using one or more heaters and temperature sensors to locally control the temperature of a substrate are described in copending U.S. patent application publication no. US 2012-0013865, which document is incorporated herein by reference in its entirety. The arrangements described therein can be modified to make use of a resistive heater and temperature sensor as described herein.

Figure 10:
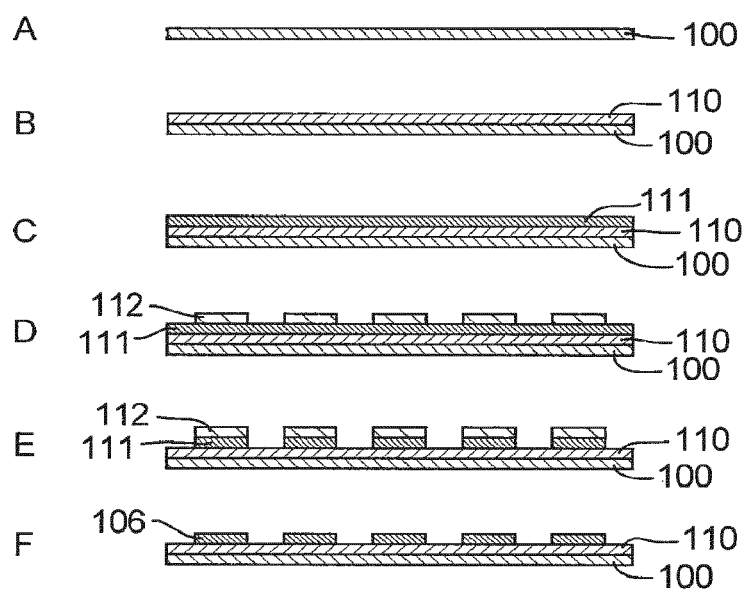
FIG. 10 depicts steps in a method of manufacturing a substrate holder according to an embodiment of the invention.

FIG. 10 shows steps A to F of a method to form a substrate holder according to an embodiment of the invention. Starting with a flat blank of suitable shape and thickness to form the substrate holder 100, shown in A, a thin-film stack 110 is formed, as shown in B (see also FIG. 9). The thin-film stack can be formed in several sub-steps. The first sub-step is to form a bottom isolation layer on the surface of the substrate holder 100. As mentioned above, this may include providing several thin-film layers of isolation material (e.g. to reduce or eliminate pinholes and cracks). Such a method can maintain and ensure the smoothness of the surface on which one or more further layers may be formed.

The second sub-step is to form one or more various different components as described below. The formed layer may be a patterned layer of, for example, conductive material. The conductive material desirably includes a metal. This second sub-step may itself comprise a series of sub-steps, for example lithographic patterning and etching. The patterning and etching may pattern the layer to form the one or more components in the layer.

The third sub-step is to form the top isolation layer on top of the metal pattern. The top isolation layer electrically isolates the patterned conductive layer from electrical conduction to an object applied from above or a short circuit to another part of the patterned layer. Again, this may include providing several thin-film layers of isolation material. Depending on the complexity of the component, one or more further conductive and isolating layers may be applied.

Next, as shown at C, a layer of burl-forming material 111 is provided on the thin-film stack 110. The layer of burl-forming material is to be patterned to form the burs in one or more subsequent steps of the method. The burl-forming material can be selected from the group comprising diamond such as diamond-like carbon (DLC), SiC, $SiO_2$, TiN and CrN. To form the burls from layer 111, a patterned metal mask 112 is formed on the top isolation layer as shown at D. This may be achieved via a combination of metal layer and photo-resist deposition and lift-off via lithography and selective etching. Then, layer 111 is dry etched, for example by directing a plasma (e.g. oxygen and/or fluorine) through the metal mask 112 to arrive at the state shown at E. In the state shown in E, the parts of the layer of burl forming material 111 which are not covered by the patterned metal mask are removed, e.g. etched, away. The top of the thin-film stack 110, i.e. a top surface of an isolation layer, is thus revealed from under the layer of burl forming material. Removal of the metal mask by a conventional method leaves the finished substrate holder as shown in F. If desired, a coating can be provided on top of the buds 106. It is possible to adjust or correct the shape and/or profile of the burls using, for example, ion beam figuring.

Figure 11:
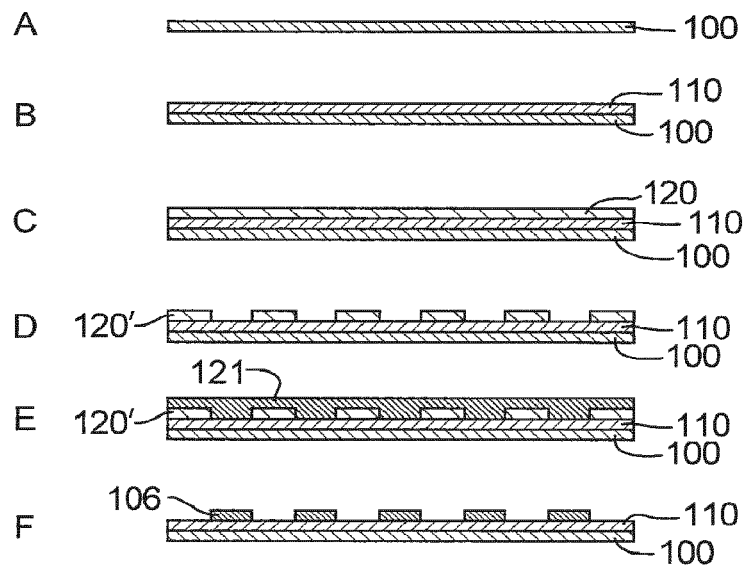
FIG. 11 depicts steps in a method of manufacturing a substrate holder according to an embodiment of the invention.

A further method to form a substrate holder is a sputtering method shown in FIG. 11. The second method is similar to that of FIG. 10 and has the same steps A and B. At step C, a negative tone photo-resist 120 is provided. Then the negative tone photo-resist is patterned at D to form openings in the resist layer. The openings are at locations at which burls are to be formed (i.e. the patterned resist 120' forms a mask). The openings in the negative tone photo-resist 120 reveal the surface of the thin-film stack, e.g. the outermost isolation layer 110. Burl material 121 is then provided, e.g. by sputter deposition, at step E, such that it fills the openings in the resist layer. The bud material forms a layer over the resist layer 120. The excess burl material is removed by, e.g., polishing, to expose the resist layer 120'. Then the remaining resist 120' is removed. The bud material is left behind forming an arrangement of buds 106, as shown at F. In this method, the same materials can be used to form the burls as in the above described method.

Figure 12:
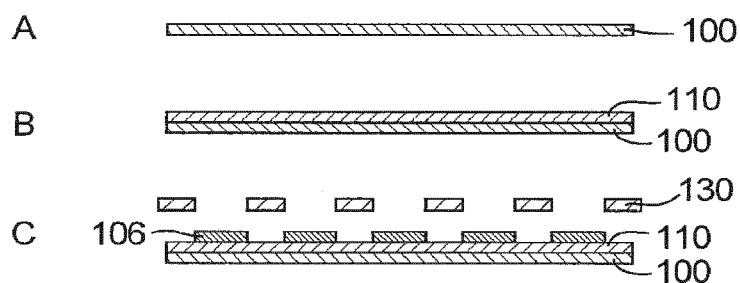
FIG. 12 depicts steps in a method of manufacturing a substrate holder according to an embodiment of the invention.

A further method of forming a substrate holder uses direct deposition, as shown in FIG. 12. In this method, steps A and B are the same as for the methods of FIG. 10 and/or FIG. 11. In step C, a hard-mask 130 is provided over the substrate holder/table surface. The mask is patterned with openings in negative to the desired pattern of buds to be formed on the thin-film stack 110. The burl material is then supplied through the hard mask 130. The burl material deposits on the surface of the thin-film stack, e.g. the outermost isolation layer, to form a deposit having the desired bud pattern, for example an array of burls 106. In this method, the same materials can be used to form the burls as in the above described methods.

Figure 18:
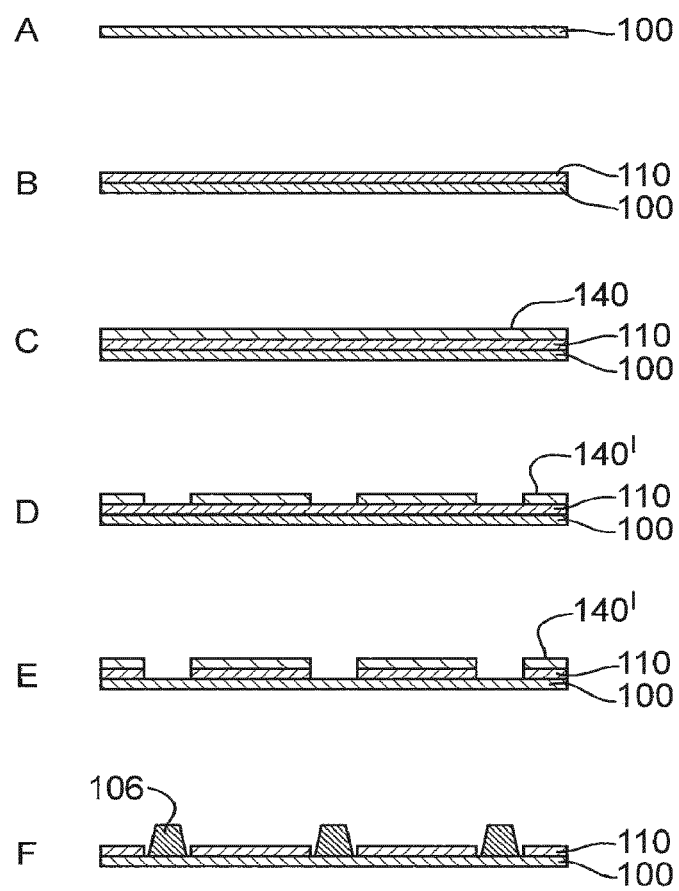
FIG. 18 depicts steps in a method of manufacturing a substrate holder according to an embodiment of the invention.

In a further method, the burls 106 are deposited directly onto the initial surface of the substrate holder. This is depicted in FIG. 18. The layers of the thin-film stack 110 are formed on the initial surface of the substrate holder 100 before the buds are deposited. Steps A and B are the same as for the methods described with respect to FIGS. 10, 11 and/or 12. The thin-film stack is selectively etched according to a pattern to reveal parts of the initial surface. Selectively etching the thin-film stack can be performed by depositing a photo-resist layer 140 in step C, then selectively exposing the photo-resist and developing it. This forms a patterned resist layer 140' having openings at locations corresponding to the positions at which buds are to be formed as shown in step D. The next step, step E, is to etch the thin-film stack through the openings in the patterned resist layer 140'. Buds 106 are then formed at step F in the openings in the thin-film stack 110 (before or after removal of resist layer 140').

Various processes can be used to form the burls 106 in this method. For example, it is possible to use steps D to F of the method of FIG. 11 or step C of the method of FIG. 10 or step C of the method of FIG. 12. In another process, material for forming the buds is deposited in a layer, covering the thin-film stack and filling the openings in the thin-film stack. The burl material covering the thin-film stack is removed for example by etching through a mask. The buds can then be shaped. This method can be desirable, although it might have more steps than other methods, because the burl material can be of similar material (i.e. ceramic) or even the same material as the substrate holder. Similar materials are more likely to form a more secure bond than dissimilar materials.

In a further method, explained below with reference to FIGS. 19A to 19E, laser sintering is used to form the burls. This method starts with a flat plate of the desired shape which forms the main body 400 of the substrate holder. In an embodiment the plate is formed of SiSiC but another material such as Invar™, Zerodur™, ULET™, fused silica, cordierite, boron nitride, silicon nitride, aluminum nitride (AlN) and/or SiC can also be used. Desirably, an initial surface 400a of the plate is ground and/or polished to a desired degree of flatness. In an embodiment, the initial surface is cleaned, e.g. with ozone, but this step may be omitted in many cases. In an embodiment, the initial surface is treated to promote adherence of one or more subsequent layers, e.g. by application of a primer layer, but again this step may be omitted in many cases. On the plate, an isolation layer 410 is applied to isolate one or more metal layers to be formed above it from the main body of the substrate holder and to further improve flatness (if desired). The isolation layer 410 may be made of BCB applied by spin or spray coating as described above or of $SiO_2$ applied by a PECVD process, or other suitable material, e.g. as described above. On top of the isolation layer, a metal layer 440 is applied, e.g. by PVD, to arrive at the situation shown in FIG. 19A.

Figure 19A:
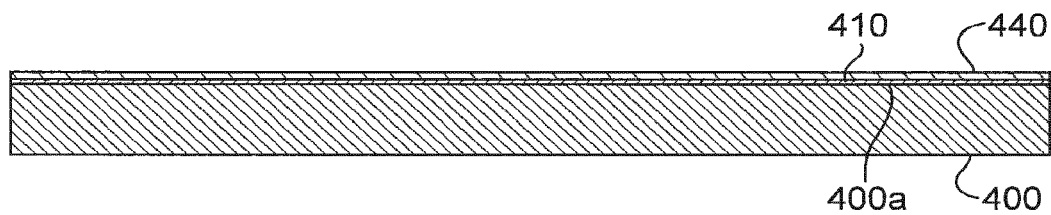
FIGS. 19A to 19E depict steps in a method of manufacturing a substrate holder according to an embodiment of the invention.
Figure 19B:
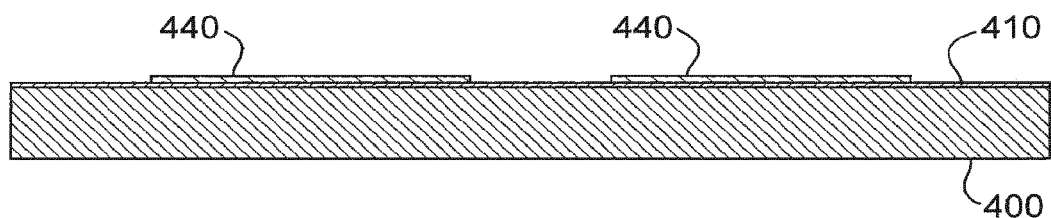

The metal layer is then patterned. e.g. by lithography and selective etching, e.g. a wet etch, to define the desired pattern to form a desired component, e.g. one or more electrodes, sensors and/or heaters. This step also removes the metal layer in an area where buds are to be formed in a subsequent step. At this stage, the substrate holder is as illustrated in FIG. 19B.

Figure 19C:
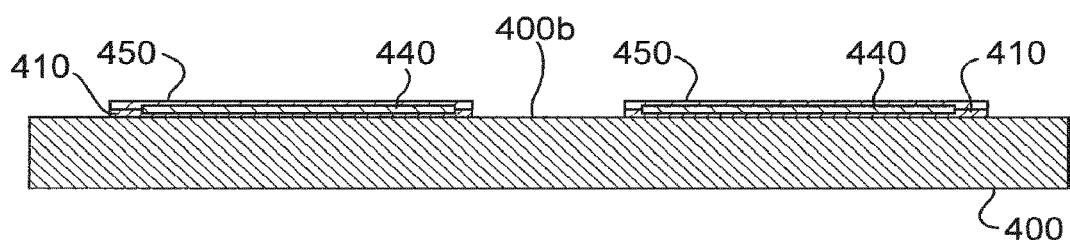

Over the patterned metal layer, a second isolation or dielectric layer 450 is applied and one or more openings through to the base layer, i.e. through both isolation layers, are formed in the locations where burls are desired. The substrate holder is now as illustrated in FIG. 19C. Optionally, the exposed area 400b of the initial surface of the main body 400 is cleaned, e.g. with ozone, and/or treated, e.g. by application of a primer layer to promote adhesion of the buds which are to be formed subsequently. Burls 406 are now formed in the opening through the thin film stack by a laser sintering process. There are two types of laser sintering methods, both are usable in the embodiment described herein.

In the first method, a thin layer of powder is applied to the area where burls are to be formed then one or more laser beams are used to selectively sinter the powder in the area where the burls are to be formed. When that is complete, another thin layer of powder is applied and selectively heated and sintered. This is repeated so that the bud is built up layer by layer. Since the sintering pattern can be varied at each layer, the burl can be built up with any desired shape and profile. In this method, the powder may be applied over a large area and multiple burls formed simultaneously or concurrently. Alternatively, powder may be applied to a small area and each bud formed independently. Further details of this process can be found in "Laser micro sintering—a quality leap through improvement of powder packing" by A Streek et al published at http://laz.htwm.de/43_rapidmicro/55_Ver%C3%B6ffentlichungen/Laser%20micro%20sintering/a20-%20a%20quality%20leap%20through%20improvement%20of%20powder%20packing.pdf.

In the second method, powder is jetted in an inert gas over the area where a burl is to be formed while one or more laser beams irradiate the precise locations where burs are to be formed. Powder selectively adheres to the positions irradiated by the laser beam and by suitably shifting the point of radiation, a burl of desired profile can be built up. Further details of this process can be found in "MICRO-CLADDING USING A PULSED FIBRE LASER AND SCANNER" by S. Kloetar et al published at http://laz.htwm.de/43_rapidmicro/55_Ver%C3%B6ffentlichungen/Microcadding_LPM2010.pdf.

As with other sintering techniques, laser sintering works by partially melting particles of the powder so that they adhere together when they cool. Laser sintering has an advantage that the controlled application of the laser beam allows for spatial control of where sintering takes place. In both methods described above, the powder can be preheated to a temperature close to the relevant melting point so that less energy need be applied by the laser to complete the sintering. A wide variety of materials can be used in sintering techniques. The powder can be formed of a single material, e.g. a metal such as titanium, a semiconductor such as silicon or a ceramic such as fused silica, cordierite and/or aluminum nitride. In a further embodiment, the powder is made of two or more components. One component has a relatively low melting point which melts to form a matrix in which the other particulate component(s) is(are) embedded. The matrix-forming component of the powder can be provided as separate particles or as a coating on particles of other materials. The matrix forming compound can be any of the single materials mentioned above. The particulate component can be one or more components selected from the group comprising cubic boron nitride, silicon nitride, silicon carbide, titanium nitride, titanium carbide and/or diamond, e.g. DLC. The sintering process can be carried out in an inert atmosphere or a vacuum to help prevent chemical change to the material being sintered or in a controlled atmosphere to promote a chemical change.

Thus, the material from which the burl is to be formed can be selected from a wide range of materials to provide one or more desired properties such as strength of adherence to the material of the base body of the substrate holder. Desirably, the burl is made of the same material as, or a material compatible with, the material of the main body of the substrate holder. For example, it is generally desirable that the burl bond well to the base material of the main body of the substrate so as to provide longevity and robustness in use. In some applications, it is desirable that the buds have high thermal conductivity to assist in temperature conditioning of the substrate. In other applications, a low thermal conductivity can be desirable in order to isolate the substrate. Other relevant properties of the burls that can be affected through choice of material include electrical conductivity, dielectric strength and wear resistance.

Figure 19D:
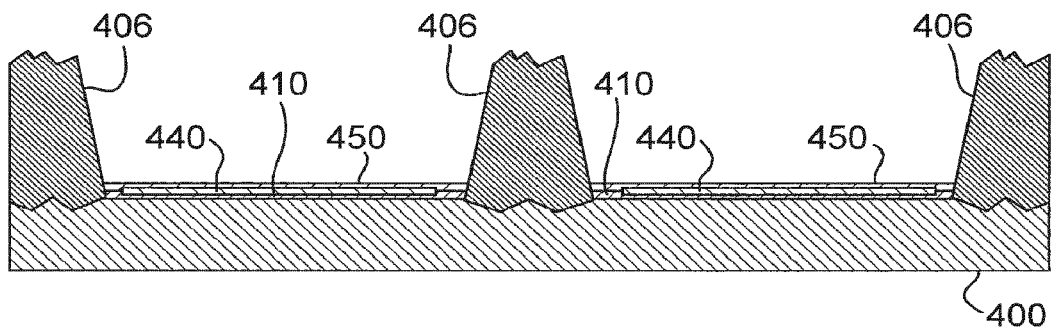
Figure 19E:
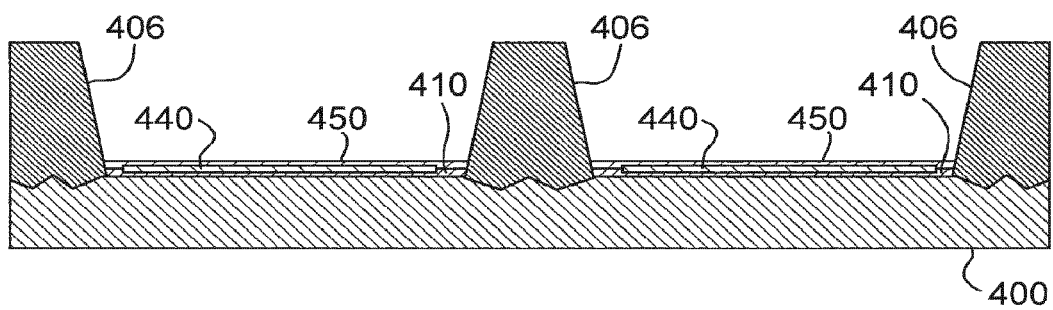

The laser sintering technique for forming the buds generally results in a rough upper surface to the buds as depicted in FIG. 19D. If so, it is desirable to perform a final polishing step so as to provide a smooth upper surface to the burls as illustrated FIG. 19E. In some cases, e.g. if the final polishing is performed with a coarse-grained slurry, it might be desirable to first protect the thin film stacks with an additional coating. However this is often not necessary, for example where the thin film stack contains only electrodes for clamping purposes.

Figure 20:
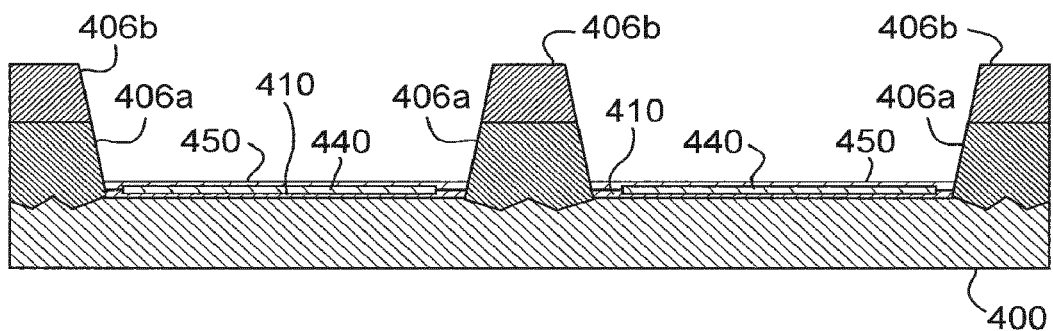
FIG. 20 depicts a substrate holder according to an embodiment of the invention.

A further advantage of the laser sintering process is that it allows the composition of a burl to be varied through its height. It is therefore possible to manufacture burls having sections or layers of a different composition and/or property as illustrated in FIG. 20. For example, a lower part 406a of the burl can be formed of material that bonds well to the material of the base body of the substrate holder, while the upper part 406b of the burl is formed of a material having an improved wear property. For example, particles of diamond e;g. DLC can be included in the upper part 406b of the burl to improve wear resistance. In an embodiment a burl is formed with more than two distinct layers. In an embodiment a burl is formed with a gradual change in composition, content or material property through at least a part of its height.

It is also possible to vary the composition of the powder to be sintered in a direction substantially parallel to the surface on which the buds is being formed. In the powder layer method of sintering, this may be achieved through variation of the composition of the powder within each layer of powder as it is applied. In the powder jetting method this may be achieved through variation of the composition of the jetted powder with time in synchronization with movement of the point of laser irradiation. Varying the material composition of the bud in a direction substantially parallel to the surface on which it is formed, optionally in addition to variation in the height direction, can allow fine control over one or more mechanical and/or other properties of the burl, e.g. stiffness.

An advantage of this laser sintering embodiment is that burs can be formed with almost any shape in three dimensions. In an embodiment, a burl has a constant cross-section throughout its height. In an embodiment, a burl tapers away from the main body of the substrate holder. In an embodiment, the cross-section of a burl varies with height. In an embodiment, a burl has a cross-section substantially parallel to the surface of the main body of the substrate holder that is selected from the group consisting of circle, square, rectangle, oval, rhombus and/or "racetrack" or "stadium" shape. A "racetrack" or "stadium" shape has two straight parallel sides joined by curves, e.g. semicircles.

Although specific methods have been described above which may be used to form burls, sensors, heaters and an electrostatic clamp, in a unitary manner as a multi-layer structure, any other suitable method may be used. In an embodiment of the invention, a thin-film stack is provided on only one side of the substrate holder. In an embodiment, thin-film stacks are provided on both sides of the substrate holder. In an embodiment, buds are provided on both sides of the substrate holder. If buds are provided on a side of the substrate holder that does not have a thin-film stack thereon, any convenient method for forming the buds on that side can be used. Such methods include those described above as well as other methods, such as machining that involve removal of material from the main body. Deposition of the layers can be achieved by Plasma Enhanced Chemical Vapor disposition (PE CVD), Chemical Vapor Deposition (CVD), Physical Vapor Deposition (PVD) and/or sputtering. The method used for the deposition depends upon the material(s) being deposited. The thickness variation obtained by the deposition can be smaller than 5 percent.

A substrate holder for use in a conventional (DUV) lithographic apparatus (e.g. an immersion lithographic apparatus) is desirably provided with one or more thin-film temperature sensors and/or thin-film heaters.

A substrate holder for use in an EUV lithographic apparatus is desirably provided with a thin-film electrostatic clamp and optionally one or more thin-film temperature sensors and/or thin-film heaters.

Figure 13:
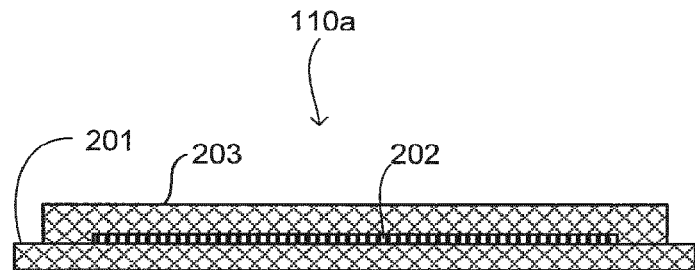
FIGS. 13 to 15 depict thin-film stacks according to embodiments of the invention.
Figure 14:
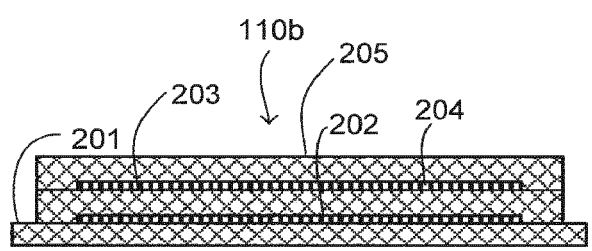
Figure 15:
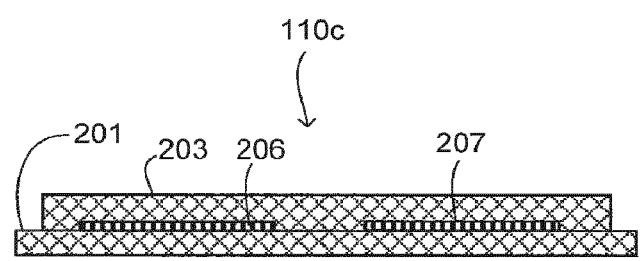

Examples of thin-film stacks, incorporating electric or electronic components, that are usable in embodiments of the invention are shown in FIGS. 13 to 15 and described below.

FIG. 13 shows a thin-film stack comprising an isolation layer 201, one or more metal lines 202 and isolation layer 203. Isolation layer can be formed of PE CVD (Plasma Enhanced Chemical Vapor Deposition) $SiO_x$. The isolation layer 201 desirably has a thickness greater than 0.1 µm. Desirably it has a thickness less than 10 µm. In an embodiment the isolation layer has a thickness of 5 µm.

On top of the isolation layer, one or more metal lines 202 are deposited by photolithography or metal deposition and etching through a hard mask. Metal line 202 desirably has a width greater than 20 µm. The maximum width of the metal line is determined by its function and available space. Other methods of forming the metal line are usable. In the case of a heater and/or sensor, one or more wide metal lines (e.g. about 1500 µm) can be used as a heating element and a narrow metal line (e.g. about 100 µm) can be used as a sensor element. For an electrostatic clamp, two halves of continuous metal film (but isolated from the burl tops) separated by approximately 500 µm from each other can be deposited to form positive and negative elements of the electrostatic clamp. Metal line 202 desirably has a layer thickness greater than about 20 nm, desirably greater than about 40 nm. Metal line 202 desirably has a layer thickness less than or equal to about 1 µm, desirably less than about 500 nm, desirably less than about 200 nm.

For a heater and/or sensor, a patterned metal line 202 can have multiple metal layers, for example titanium (Ti) and platinum (Pt). In an embodiment a layer of 10 nm thick titanium provides improved adhesion for a platinum line of approximately 250 thickness. Patterning of multiple layers can be achieved using a combination of photo-resist deposition, PVD for metal film deposition and a lift-off process. For a heater, a wide chromium line (~1500 µm) can be deposited by Cr film deposition (PVD) and selective Cr etching using a mask. For an electrostatic clamp, an electrode can consist of aluminum, chromium or any other conductive material. An electrode can be formed by PVD or sputtering. An alloy of these metals in any suitable combination can also be used.

It is desirable to electrically isolate a deposited metal line from above and protect it from particle depositions, scratches and oxidation. Hence a top or outermost isolation layer is deposited on the metal line 202. For a heater or a sensor, the isolation layer can be deposited by spray coating of BCB (40% bis-benzocyclobutene dissolved in 1,3,5-trimethyl benzene) or NN 120 (20% perhydropolysilazane in di-butyl ether); $SiO_x$ as described previously; or a combination of sprayed layers and $SiO_x$. In the case of an electrostatic clamp, a top isolation layer also provides dielectric strength so that the clamping pressure and gap between the layer stack and substrate can be tuned to desired values. In an embodiment, the top isolation layer for an electrostatic clamp has, or consists of, spray coated polymer layers of BCB, NN 120 (or combination of these two sprayed materials), $SiO_x$ alone, a combination of spray coated polymer layers and $SiO_x$, or parylene (CVD) alone. The top isolation layer 203 desirably has a layer thickness greater than about 0.1 µm, desirably greater than about 1 µm. The top isolation layer 203 desirably has a layer thickness less than about 10 µm, desirably less than about 3 µm, for a heater or a sensor. For an electrostatic clamp, the top isolation layer desirably has a layer thickness less than about 100 µm, desirably less than about 20 µm. In an embodiment the thickness is in a range from about 10 to about 60 µm.

Table 1 shows an examples of suitable materials per layer in order to build a thin-film stack. Each layer may be formed of one of the listed materials or a combination of two or more materials. Methods of application are indicated in parenthesis.

TABLE 1

| Appl. Layer | 1. Heater only | 2. Sensor & Heater | 3. Clamp |
|---|---|---|---|
| Bottom isolation | BCB (spray) | BCB (spray) | BCB (spray) |
| | CAG 37 (spray) | CAG 37 (spray) | CAG 37 (spray) |
| | NN 120 (spray) | NN 120 (spray) | NN 120 (spray) |
| | SiOx, (PVD/CVD/PECVD/ Sputtering) | SiOx, (PVD/CVD/PECVD/ Sputtering) | SiOx (PVD/CVD/PECVD/ Sputtering) |
| | Polyimide (spray) | Polyimide (spray) | Parylene (CVD) |
| | | | Polyimide (Spray) |

TABLE 1-continued

| Appl. Layer | 1. Heater only | 2. Sensor & Heater | 3. Clamp |
|---|---|---|---|
| Metal layer | Chrome (PVD/CVD/Sputtering) | Platinum (PVD/CVD/Sputtering lift-off) | Chrome, Aluminum (PVD/CVD/Sputtering) |
| Top Isolation | BCB (spray) CAG 37 (spray) NN 120 (spray) SiOx (PVD/CVD/PECVD/ Sputtering) Polyimide (spray) | BCB (spray) CAG 37 (spray) NN 120 (spray) SiOx (PVD/CVD/PECVD/ Sputtering) Polyimide (spray) | BCB (spray) CAG 37 (spray) NN 120 (spray) SiOx (PVD/CVD/PECVD/ Sputtering) Parylene (CVD) Polyimide (spray) |

Table 2 shows examples of specific function and requirements per layer for the applications:

TABLE 2

| Appl. Layer | 1. Heater only | 2. Sensor & Heater | 3. Clamp |
|---|---|---|---|
| Bottom isolation | moderate electrical isolation low temperature difference across the layer short response time | high electrical isolation (for sensor resolution) low temperature difference across the layer short response time | high dielectric strength high volume resistivity low temperature difference across the layer |
| Metal layer | heater power | sensor sensitivity sensor stability heater power | high voltage requirements (electrode layout) |
| Top isolation | encapsulation | encapsulation | high dielectric strength high volume resistivity low temperature difference across the layer |

Thin-film technology offers an overlay improvement and a cost effective solution for heater and/or sensor development. Metal pattern designs can be modified easily (by modifying mask designs). If a platinum (Pt) metal layer is used, a titanium adherence layer can first be applied to improve adhesion of the Pt layer. For electrostatic clamps, any suitable metal having a low resistance can be used.

Dielectric layers can be deposited by spray coating, spin coating and PE CVD techniques. Spray coating is particularly suitable for depositing a polymer based layer (dissolved in organic solvent) such as a BCB and/or NN 120 layer. But a first sprayed layer may suffer from surface defects such as pin-holes (because of local impurities) and cracks (most likely because of stresses induced in the layers) if too thick a layer is deposited. It is possible to reduce the effect of these surface imperfections by combining different deposition processes. In an embodiment of the invention, layers can be applied using an inkjet or bubblejet printing technique. This allows for local control of the layer thickness, which can be useful to correct for local variation in the surface contour or the surface roughness of the substrate holder. These techniques also enable patterning of a conductive layer using a conductive ink. A combination of different materials and/or layer formation techniques can be desirable as a defect in one layer can be cured by another layer.

A thin-film stack 110b shown in FIG. 14 by way of example comprises, in order above the base layer 100, first isolation layer 201, a first metal layer (e.g., metal lines) 202, second isolation layer 203, second metal layer (e.g., metal lines) 204 and third isolation layer 205. Each of these layers can be formed by a suitable method as described herein. One or more further metal layers and one or more further isolation layers can also be provided. In this embodiment, the use of two or more stacked metal layers allows the formation of two or more stacked components, e.g. sensors. Stacked sensors can provide increased isolation from noise. In an embodiment, one or more metal layers can act as shielding for one or more signal lines in another layer.

A thin-film stack 110c shown in FIG. 15 comprises first isolation layer 201 and second isolation layer 203 either side of the electronic or electric components 206, 207. That is the components are sandwiched between the first and second isolation layers. Multiple components may be formed in a single layer on the substrate. In an embodiment, each of the components 206, 207 is formed by a plurality of layers. For example successive layers of the component may consist of metal-amorphous silicon-metal. In such an embodiment, one or more of the components 206, 207 forms a transistor or other logic device. Such logic devices can be used to control an array of heaters disposed across the surface of the substrate holder without requiring individual connections to each heater. The transistors can be arranged at the intersection of word and bit lines and each connected to an associated heater to form an active matrix.

Figure 16:
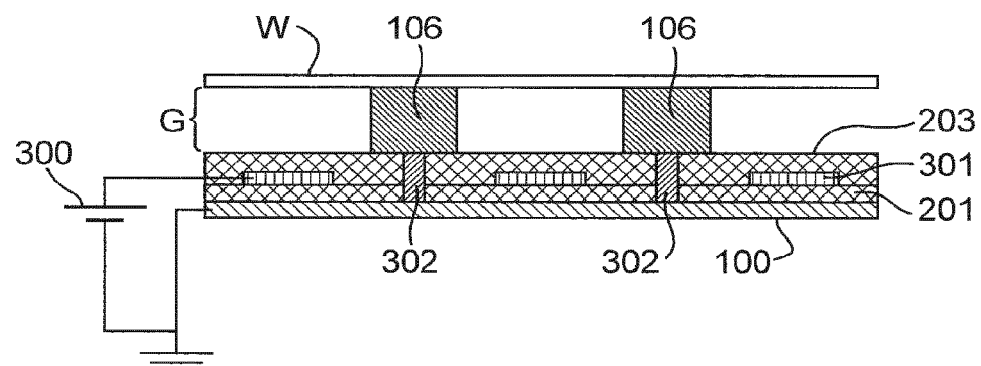
FIG. 16 depicts schematically an electrostatic clamp arrangement according to an embodiment of the invention.
Figure 17:
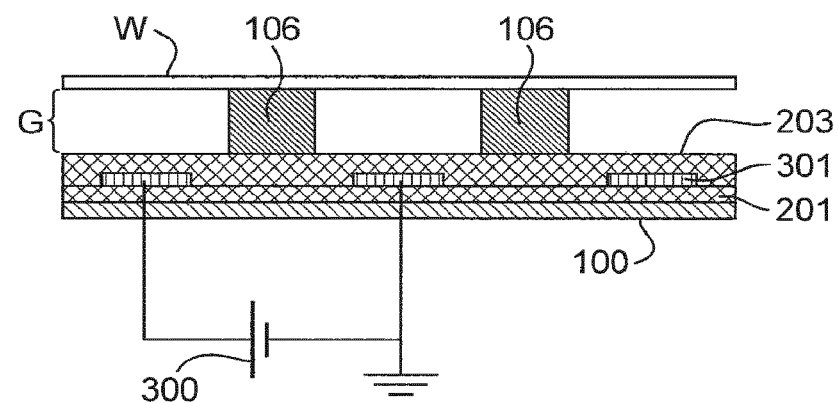
FIG. 17 depicts schematically another electrostatic clamp arrangement according to an embodiment of the invention.

FIGS. 16 and 17 depict, in cross-section, electrostatic clamping arrangements of substrate holders according to embodiments of the invention.

In the substrate holder of FIG. 16, a thin-film stack—comprising first isolation layer 201, electrode layer 301 and second isolation layer 203—is formed on the main body 100 of the substrate holder. Electrode layer 301 is shown in this view as three separate parts but these are electrically continuous. Optional vias 302 (i.e. electrical pathways) pass through the thin-film stack to electrically connect the main body 100 to burs 106 formed on the thin-film stack as described above. A voltage source 300 applies a potential, e.g. in the range of 10 to 5,000 V to the electrode layer 301. The main body 100 is grounded, as are the burls 106 and substrate if the vias 302 are provided. The electric field generated by the potential applied to the electrode layer 301 causes an electrostatic force to clamp the substrate W to the substrate holder.

The substrate holder of FIG. 17 is similar except that the vias 302 are omitted and electrode layer 301 is divided into two (or more) electrically separate parts. The voltage source applies a potential difference, e.g. in the range of 10 to 5,000 V, between two parts of the electrode layer 301. One of the parts of the electrode layer 301 is grounded. The resulting field generates an electrostatic clamping force in a similar manner.

One or more sensors and any associated burls are desirably arranged to as to minimize pickup of electromagnetic interference, as described in corresponding U.S. patent application No. U.S. 61/576,627, filed on 16 Dec. 2011, which document is incorporated by reference in its entirety.

While discussion herein has focused on heaters, an embodiment of the invention applies to an electric or electronic component that generally provides heat transfer function. Accordingly, the electric or electronic component may be, for example, a cooler or a combination of heater/cooler.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention, at least in the form of a method of operation of an apparatus as herein described, may be practiced otherwise than as described. For example, the embodiments of the invention, at least in the form of a method of operation of an apparatus, may take the form of one or more computer programs containing one or more sequences of machine-readable instructions describing a method of operating an apparatus as discussed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing and sending signals. One or more multiple processors are configured to communicate with at least one of the controllers. For example, each controller may include one or more processors for executing the computer programs that include machine-readable instructions for the methods of operating an apparatus as described above. The controllers may include data storage media for storing such computer programs, and/or hardware to receive such media. So the controller(s) may operate according to the machine readable instructions of one or more computer programs.

An embodiment of the invention may be applied to substrates with a width (e.g., diameter) of 300 mm or 450 mm or any other size.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

In a first aspect of the invention there is provided a substrate holder for use in a lithographic apparatus, the substrate holder comprising: a main body having a surface; a thin-film stack provided on the surface and forming an electric component; and a plurality of burls provided on the thin-film stack and having end surfaces to support a substrate.

The main body may be formed of a different material than the buds. The or a component in the thin-film stack may be located at least partly between a burl and the main body. Buds may project from the thin-film stack by a distance selected from the range of from 1 to 20 µm, desirably from the range of from 5 to 15 µm. The distance may be less than 5 µm, desirably less than 3 µm.

The burls may have been formed by a process selected from the group consisting of: deposition and selective etching; sputtering through a patterned resist layer; deposition through a hardmask; and laser-sintering. The burls may be formed from a material selected from the group consisting of: diamond-like carbon, SiC, $SiO_2$, TiN and CrN. At least one burl may comprise a first layer of a first material and a second layer of a second material that is different from the first material. The burls may be cylindrical. The burs may taper away from the thin-film stack. The main body may be formed from a material selected from the group consisting of: Zerodur, Cordierite, SiC, AlN, SiSiC, ceramic and glass-ceramic.

The thin-film stack may include at least one via in electrical contact with a burl. The thin-film stack may form a plurality of electric components. A first electric component and a second electric component of the plurality of electric components may be arranged in a single layer of the thin-film stack. A first electric component and a second electric component of the plurality of electric components may be arranged in two separate layers of the thin-film stack. The component may be a component selected from the group consisting of: an electrode, a heater, a sensor, a transistor and a logic device. The electrode may be, in use, an electrode of an electrostatic clamp.

In a second aspect of the invention there is provided a substrate holder for use in a lithographic apparatus, the substrate holder comprising: a main body having surface; a thin-film stack provided on the surface and forming an electronic or electric component, the thin-film stack having a plurality of apertures formed therein; and a plurality of projections, each projection provided in an aperture of the thin-film stack, the plurality of projections being configured to support a substrate.

The surface of the main body may be the surface of a planarization layer of the main body.

In a third aspect of the invention there is provided a lithographic apparatus, comprising: a support structure configured to support a patterning device; a projection system arranged to project a beam patterned by the patterning device onto a substrate; and a substrate holder arranged to hold the substrate, the substrate holder being according to the first or second aspect of the invention.

The lithographic apparatus may comprise a substrate table and wherein the substrate holder is integrated into the substrate table.

In a fourth aspect of the invention there is provided a table for use in a lithographic apparatus, the table comprising: a main body having a surface; a thin-film stack provided on the surface and forming an electronic or electric component; and a plurality of buds provided on the thin-film stack and having end surfaces to support an object, for example a substrate.

In a fifth aspect of the invention there is provided a table for use in a lithographic apparatus, the table comprising: a recess to receive a substrate holder of the first or second aspect of the invention; and the substrate support.

In a sixth aspect of the invention there is provided a lithographic apparatus, comprising: a support structure configured to support a patterning device; a projection system arranged to project a beam patterned by the patterning device onto a substrate; and a table according to the fourth or fifth aspects of the invention.

In a seventh aspect of the invention there is provided a device manufacturing method using a lithographic apparatus, the method comprising: projecting a beam patterned by a patterning device onto a substrate while holding the substrate in a substrate holder, wherein the substrate holder comprises: a main body having a surface; a thin-film stack provided on the surface and forming an electronic or electric component; and a plurality of burls provided on the thin-film stack and having end surfaces to support the substrate.

In an eighth aspect of the invention there is provided a method of manufacturing a substrate holder for use in a lithographic apparatus, the method comprising: providing a main body having a surface; forming a thin-film stack on the surface of the main body; and forming a plurality of buds on the thin-film stack, the buds projecting from the stack and having end surfaces to support a substrate.

Forming the plurality of burls may comprise: forming a layer of bud-forming material on the thin-film stack; forming a mask on the layer of burl-forming material; etching the burl-forming material through the mask; and removing the mask.

Forming the plurality of burls may comprise: forming a mask having a plurality of apertures; providing a layer of burl-forming material to adhere to the thin-film stack through the apertures; and removing the mask and any bud-forming material overlaying the mask. Providing the layer of bud-forming material may comprise sputtering or vapor deposition. Forming the mask comprises: providing a layer of radiation-sensitive resist; exposing the resist; and developing the resist. The burls may be formed from a material selected from the group consisting of: diamond-like carbon, SiC, $SiO_2$, TiN and CrN.

In a ninth aspect of the invention there is a method of manufacturing a substrate holder for use in a lithographic apparatus, the method comprising: providing a main body having a surface; forming a thin-film stack on the surface of the main body; forming a plurality of apertures in the thin-film stack; and forming a plurality of burls in the apertures of the thin-film stack, the burs projecting from the stack and having end surfaces to support a substrate. Forming the plurality of burls may comprise forming the burs by laser sintering.

The descriptions above are intended to be illustrative, not limiting. Thus, it will be apparent to one skilled in the art that modifications may be made to the invention as described without departing from the scope of the claims set out below.

The invention claimed is:

1. A substrate holder for use in a lithographic apparatus, the substrate holder comprising:
   a main body having a first side of the main body and a second side of the main body opposite to the first side;
   a plurality of first burls at the first side of the main body and having end surfaces to support a substrate in the lithographic apparatus, wherein each of the first burls comprises a lower body portion protruding from the main body and an upper body portion above the lower body portion, wherein the lower body portions are a different material than the upper body portions, and wherein the upper body portions comprise a material selected from: diamond, diamond-like carbon, SiC, $SiO_2$, TiN, cubic boron nitride, silicon nitride, titanium, titanium carbide, cordierite or aluminum nitride; and
   a plurality of second burls at the second side of the main body,
   wherein the main body is grounded.

2. The substrate holder of claim 1, wherein the material comprises diamond or diamond-like carbon.

3. The substrate holder of claim 1, further comprising a layer between the plurality of first burls.

4. The substrate holder of claim 1, further comprising a heater provided to the main body and configured to control a temperature of the substrate and/or the main body.

5. The substrate holder of claim 1, wherein the main body is formed of a different material from the first and/or second burls.

6. The substrate holder of claim 1, wherein the number of first burls distributed across the substrate holder is more than 10,000.

7. A lithographic apparatus, comprising:
a support structure configured to support a patterning device;
a projection system arranged to project a beam patterned by the patterning device onto a substrate; and
a substrate holder arranged to hold the substrate, the substrate holder being according to claim 1.

8. A substrate holder for use in a lithographic apparatus, the substrate holder comprising:
a main body having a first side of the main body and a second side of the main body opposite to the first side;
a plurality of first burls at the first side of the main body and having end surfaces to support a substrate;
a plurality of second burls at the second side of the main body; and
a heater provided to the main body and configured to control a temperature of the substrate and/or the main body,
wherein the main body is grounded.

9. The substrate holder of claim 8, further comprising a layer between the plurality of first burls.

10. The substrate holder of claim 8, wherein at least an upper portion of each of the first burls comprises a material selected from: diamond, diamond-like carbon, SiC, $SiO_2$, TiN, cubic boron nitride, silicon nitride, titanium, titanium carbide, cordierite or aluminum nitride.

11. The substrate holder of claim 8, wherein the main body comprises at least one material selected from: Zerodur ceramic, cordierite, SiSiC, SiC, AlN, SiSiC, ceramic or glass-ceramic.

12. The substrate holder of claim 8, wherein the main body is formed of a different material from the first and/or second burls.

13. The substrate holder of claim 8, wherein the number of first burls distributed across the substrate holder is more than 10,000.

14. A lithographic apparatus, comprising:
a support structure configured to support a patterning device;
a projection system arranged to project a beam patterned by the patterning device onto a substrate; and
a substrate holder arranged to hold the substrate, the substrate holder being according to claim 8.

15. A substrate holder for use in a lithographic apparatus, the substrate holder comprising:
a main body having a first side of the main body and a second side of the main body opposite to the first side;
a plurality of first burls at the first side of the main body and having end surfaces to support a substrate; and
a plurality of second burls at the second side of the main body,
wherein (1) the main body has a thickness in a range of 1 mm to 50 mm, (2) each of the first burls and/or second burls has a height in a range of about 5 μm to about 250 μm, and/or (3) a total area of all the burls on one side of the main body is less than 3% of the total surface area of the main body, and wherein the main body is grounded.

16. The substrate holder of claim 15, further comprising a heater provided to the main body and configured to control a temperature of the substrate and/or the main body.

17. The substrate holder of claim 15, wherein the main body comprises at least one material selected from: Zerodur ceramic, cordierite, SiSiC, SiC, AlN, SiSiC, ceramic or glass-ceramic.

18. The substrate holder of claim 15, wherein each of the first burls comprises a lower body portion protruding from the main body and an upper body portion above the lower body portion, wherein the lower body portions are a different material than the upper body portions, and wherein the upper body portions comprise a material selected from: diamond, diamond-like carbon, SiC, $SiO_2$, TiN, cubic boron nitride, silicon nitride, titanium, titanium carbide, cordierite or aluminum nitride.

19. The substrate holder of claim 15, wherein the number of first burls distributed across the substrate holder is more than 10,000.

20. A lithographic apparatus, comprising:
a support structure configured to support a patterning device;
a projection system arranged to project a beam patterned by the patterning device onto a substrate; and
a substrate holder arranged to hold the substrate, the substrate holder being according to claim 15.

* * * * *